(12) United States Patent
Kwok et al.

(10) Patent No.: US 12,363,945 B2
(45) Date of Patent: Jul. 15, 2025

(54) METHOD OF FORMING SOURCE/DRAIN REGIONS WITH QUADRILATERAL LAYERS

(71) Applicant: Taiwan Semiconductor Manufacturing Co., Ltd., Hsinchu (TW)

(72) Inventors: Tsz-Mei Kwok, Hsinchu (TW); Yung-Chun Yang, New Taipei (TW); Cheng-Yen Wen, Taichung (TW); Li-Li Su, Chubei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 533 days.

(21) Appl. No.: 17/657,822

(22) Filed: Apr. 4, 2022

(65) Prior Publication Data
US 2023/0028591 A1    Jan. 26, 2023

Related U.S. Application Data

(60) Provisional application No. 63/224,485, filed on Jul. 22, 2021.

(51) Int. Cl.
*H10D 30/67*  (2025.01)
*H01L 21/02*  (2006.01)
(Continued)

(52) U.S. Cl.
CPC ... *H10D 30/6713* (2025.01); *H01L 21/02521* (2013.01); *H01L 21/0259* (2013.01);
(Continued)

(58) Field of Classification Search
CPC ......... H01L 29/78618; H01L 21/02521; H01L 21/02609; H01L 29/045; H10D 30/6713
(Continued)

(56) References Cited

U.S. PATENT DOCUMENTS

| 11,043,561 B2 | 6/2021 | Chen et al. |
| 2020/0118892 A1* | 4/2020 | Cheng ................. H01L 27/1211 |
| 2021/0313317 A1* | 10/2021 | Tsao ...................... H01L 27/088 |

FOREIGN PATENT DOCUMENTS

TW         I707404 B        10/2020

* cited by examiner

*Primary Examiner* — Quoc D Hoang
(74) *Attorney, Agent, or Firm* — Slater Matsil, LLP

(57) ABSTRACT

A method includes forming a protruding semiconductor stack including a plurality of sacrificial layers and a plurality of nanostructures, with the plurality of sacrificial layers and the plurality of nanostructures being laid out alternatingly. The method further includes forming a dummy gate structure on the protruding semiconductor stack, etching the protruding semiconductor stack to form a source/drain recess, and forming a source/drain region in the source/drain recess. The formation of the source/drain region includes growing first epitaxial layers. The first epitaxial layers are grown on sidewalls of the plurality of nanostructures, and a cross-section of each of the first epitaxial layers has a quadrilateral shape. The first epitaxial layers have a first dopant concentration. The formation of the source/drain region further includes growing a second epitaxial layer on the first epitaxial layers. The second epitaxial layer has a second dopant concentration higher than the first dopant concentration.

20 Claims, 27 Drawing Sheets

(51) Int. Cl.
*H01L 21/285* (2006.01)
*H10D 30/01* (2025.01)
*H10D 62/10* (2025.01)
*H10D 62/40* (2025.01)
*H10D 64/01* (2025.01)

(52) U.S. Cl.
CPC .. *H01L 21/02609* (2013.01); *H01L 21/28518* (2013.01); *H10D 30/031* (2025.01); *H10D 30/6735* (2025.01); *H10D 30/6757* (2025.01); *H10D 62/118* (2025.01); *H10D 62/405* (2025.01); *H10D 64/017* (2025.01); *H10D 64/018* (2025.01)

(58) Field of Classification Search
USPC .......................................................... 257/347
See application file for complete search history.

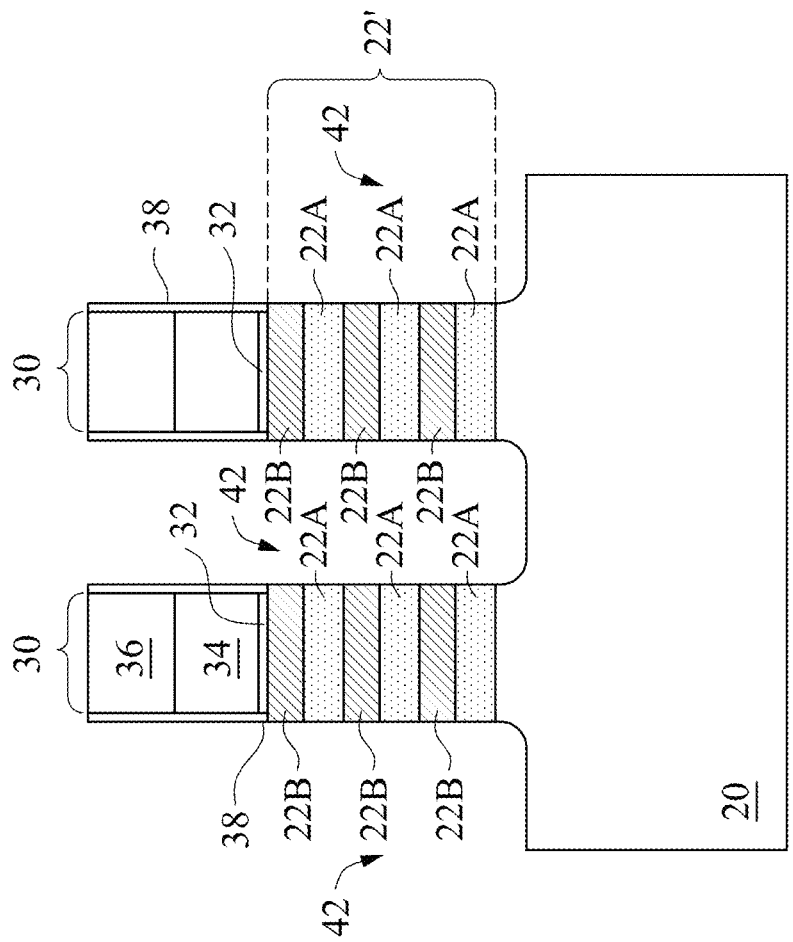
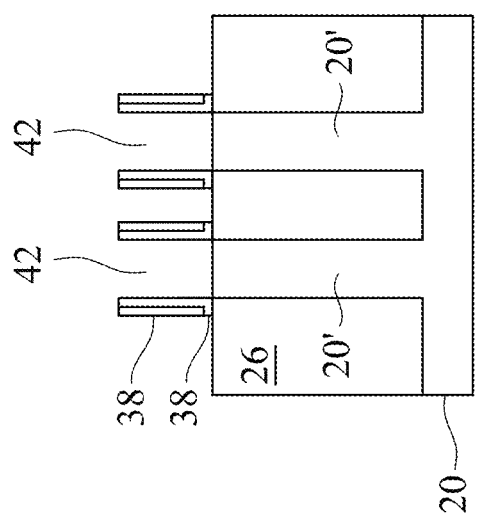
FIG. 6A
FIG. 6B

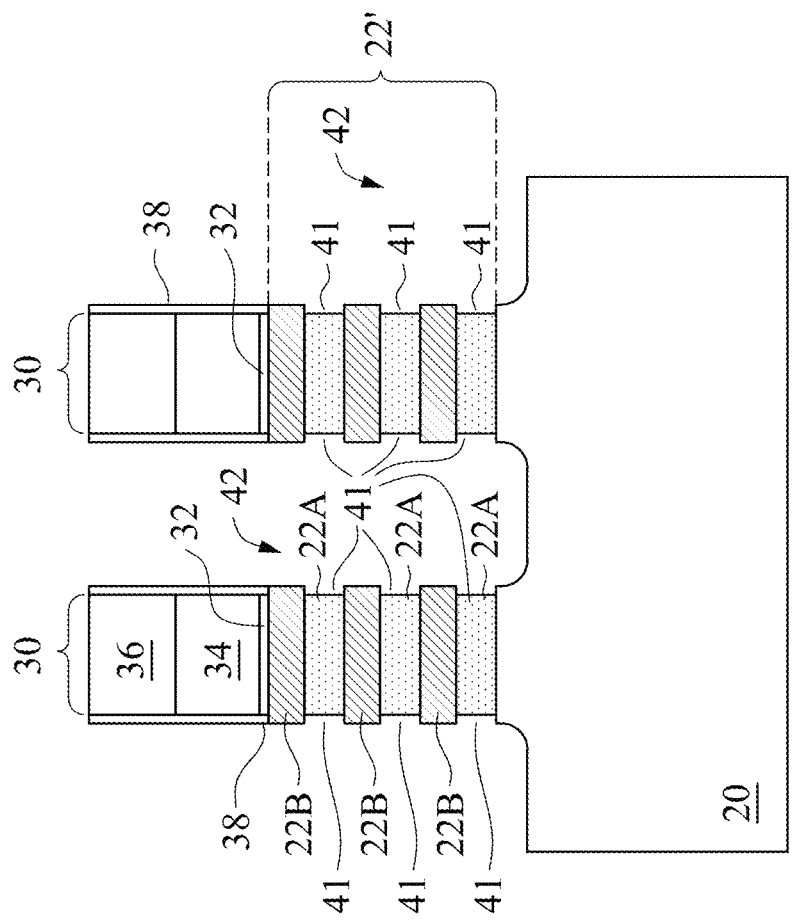
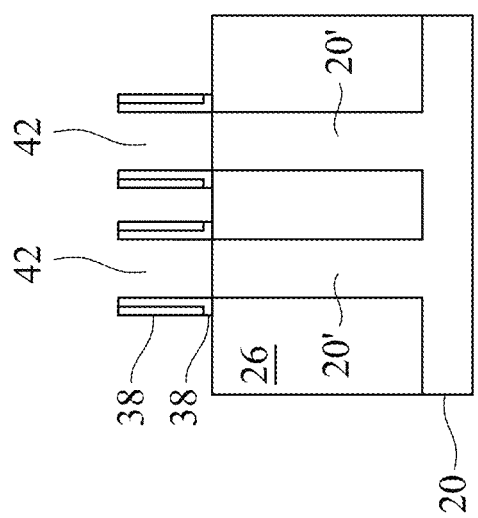
FIG. 7B
FIG. 7A

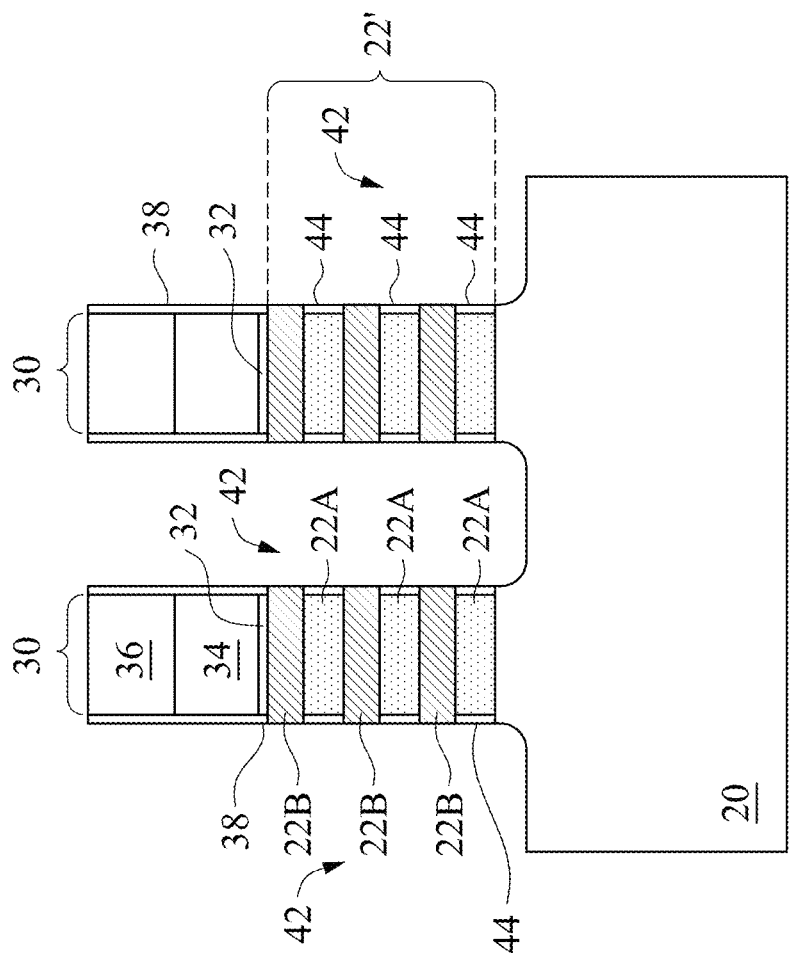
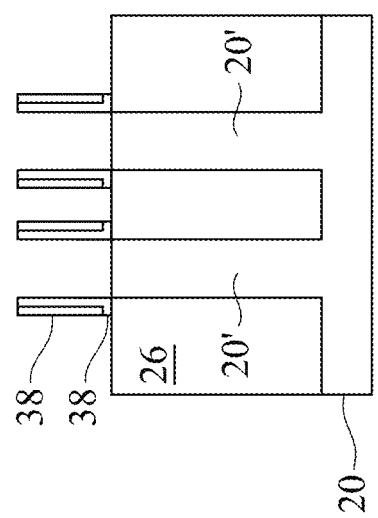
FIG. 8B
FIG. 8A

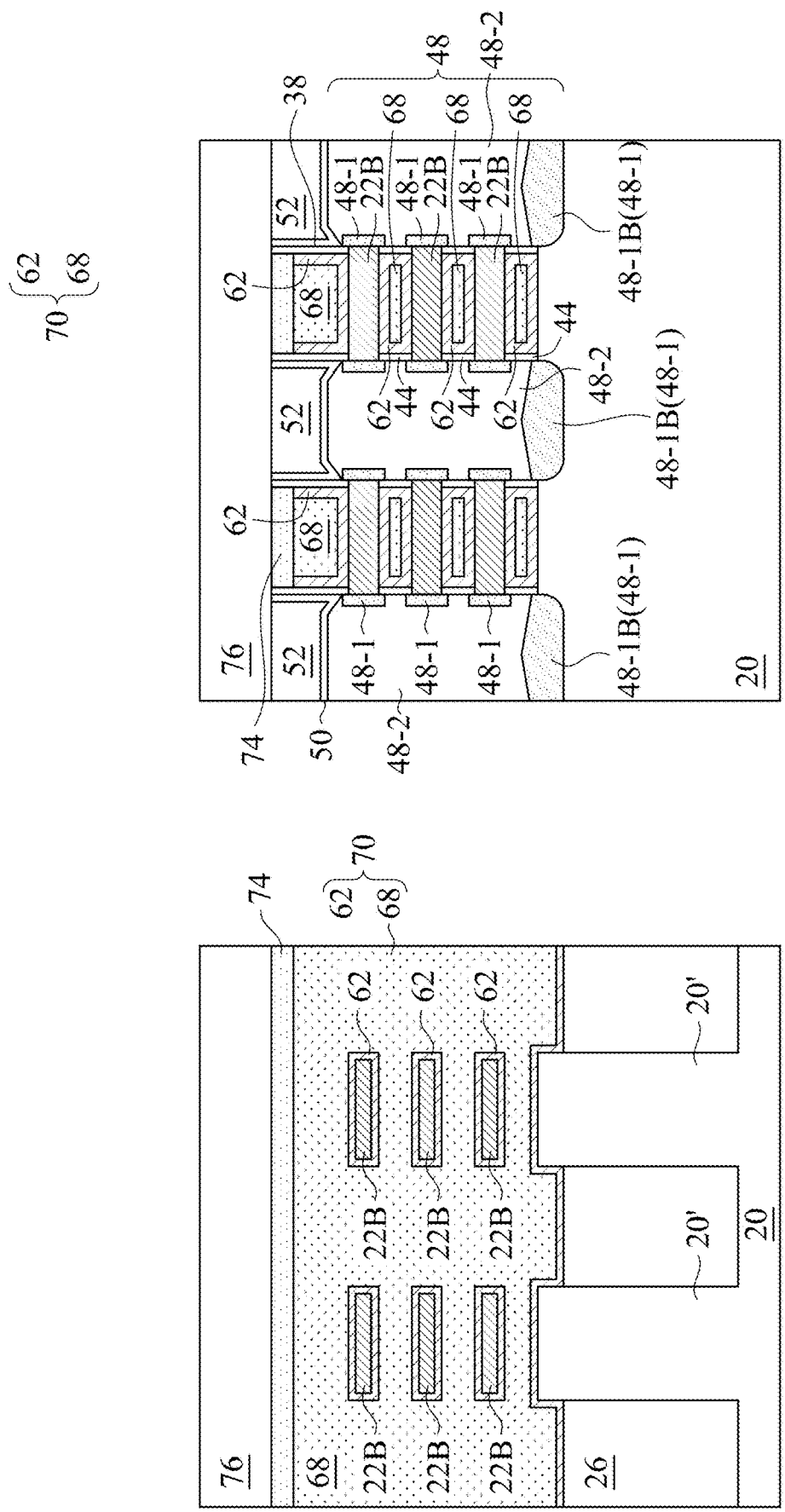

METHOD OF FORMING SOURCE/DRAIN REGIONS WITH QUADRILATERAL LAYERS

PRIORITY CLAIM AND CROSS-REFERENCE

This application claims the benefit of the following provisionally filed U.S. Patent application: Application No. 63/224,485, filed on Jul. 22, 2021, and entitled "Epi Profile Engineering for Junction Control," which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (for example, transistors, diodes, resistors, capacitors, etc.) through continual reduction in minimum feature size, which allows more components to be integrated into a given area. As the minimum feature sizes are reduced, however, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 8C, 9A, 9B, 9C, 9D, 10A, 10B, 10C, 11A, 11B, 12A, 12B, 13A, 13B, 14A, 14B, 15A, 15B, 16A, 16B, 16C, 17A, 17B, 17C, 17D, and 17E illustrate the perspective views, cross-sectional views, and top views of intermediate stages in the formation of a Gate All-Around (GAA) transistor in accordance with some embodiments.

DETAILED DESCRIPTION

Figure 1:
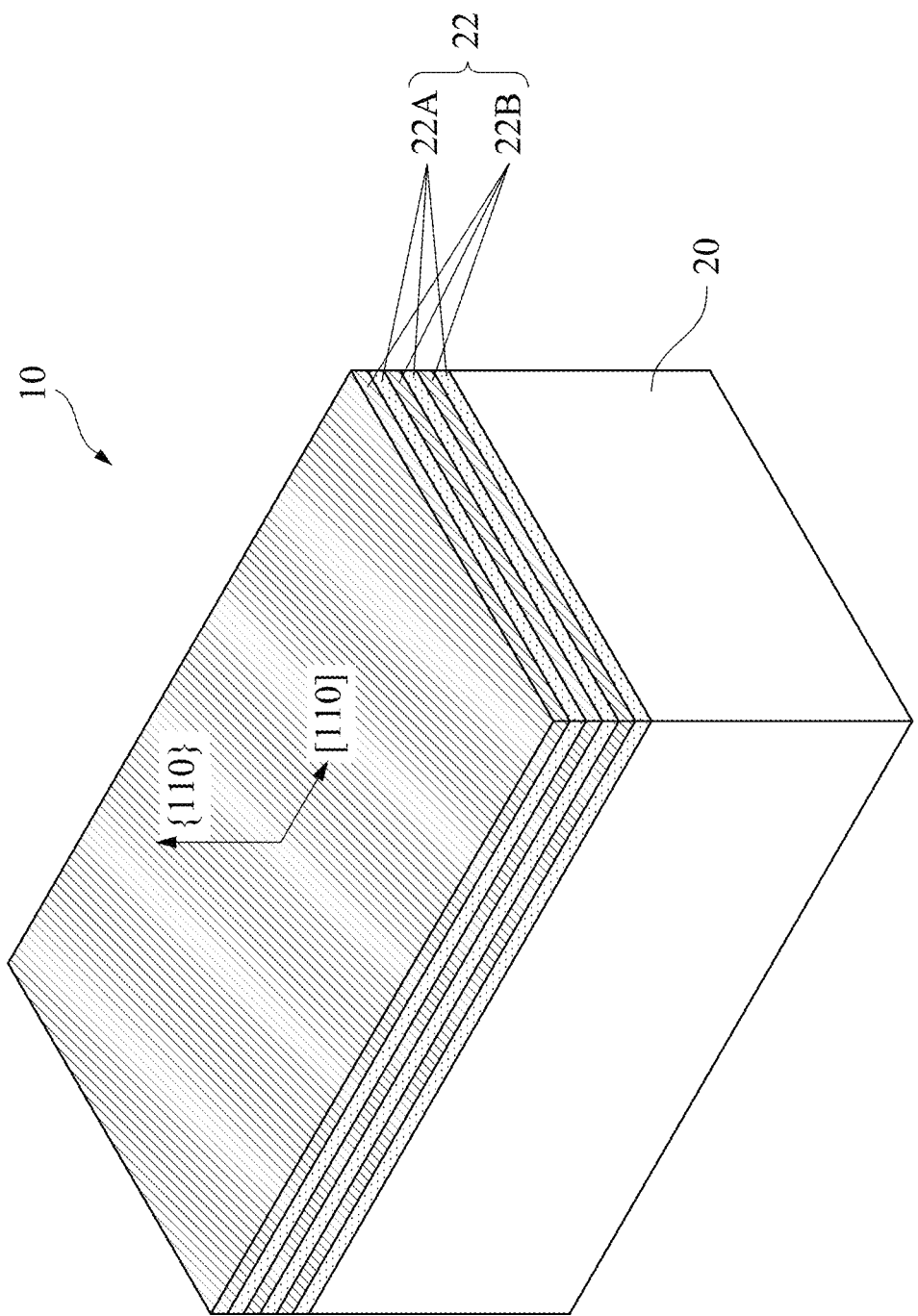

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Gate-All-Around (GAA) transistor with reduced leakage and the method of forming the same are provided. In accordance with some embodiments of the present disclosure, a {110} substrate, which has its top surface having a {110} surface orientation, is used for forming the GAA transistor. The channel direction (source-to-drain direction) is in one of the [110] directions. In the epitaxy of the source/drain regions of the GAA transistor, processes are controlled so that the layer-1 of the source/drain regions (which has a low dopant concentration) has a quadrilateral shape, and may be rectangles or trapezoids. As a result, the thickness of the layer-1 is more uniform (than the related triangular layer-1), and the junction leakage is reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 21:
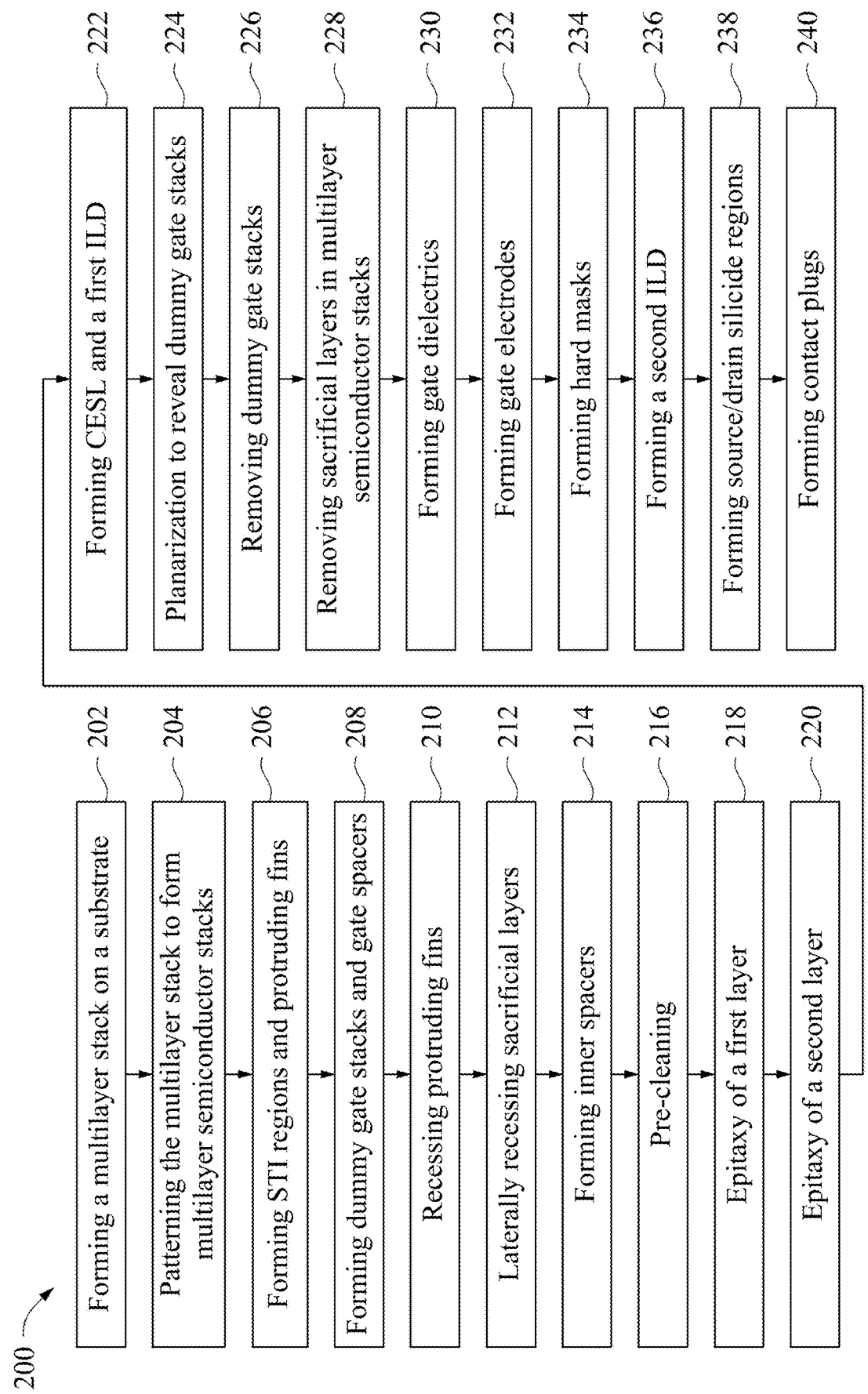
FIG. 21 illustrates a process flow for forming a GAA transistor in accordance with some embodiments.

FIGS. 1-4, 5A, 5B, 6A, 6B, 7A, 7B, 8A, 8B, 8C, 9A, 9B, 9C, 9D, 10A, 10B, 10C, 11A, 11B, 12A, 12B, 13A, 13B, 14A, 14B, 15A, 15B, 16A, 16B, 16C, 17A, 17B, 17C, 17D, and 17E illustrate the perspective views, cross-sectional views, and top views of f intermediate stages in the formation of a GAA transistor in accordance with some embodiments of the present disclosure. The corresponding processes are also reflected schematically in the process flow shown in FIG. 21.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor. Substrate 20 is a {110} substrate, which has its top surface having a {110} surface orientation, and on a {110} surface plane. The mis-cut angle of substrate 20, which is the angle of the surface plane deviating from the {110} surface plane, is smaller than about 15 degrees.

In accordance with some embodiments, multilayer stack 22 is formed through a series of epitaxy processes for depositing alternating materials. The respective process is illustrated as process 202 in the process flow 200 shown in FIG. 21. In accordance with some embodiments, multilayer stack 22 comprises first layers 22A formed of a first semiconductor material and second layers 22B formed of a second semiconductor material different from the first semiconductor material. Due to the epitaxy, the first layers 22A and the second layers 22B have the same lattice orientations as substrate 20. Accordingly, the first layers 22A and the second layers 22B also have {110} top surface orientations.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
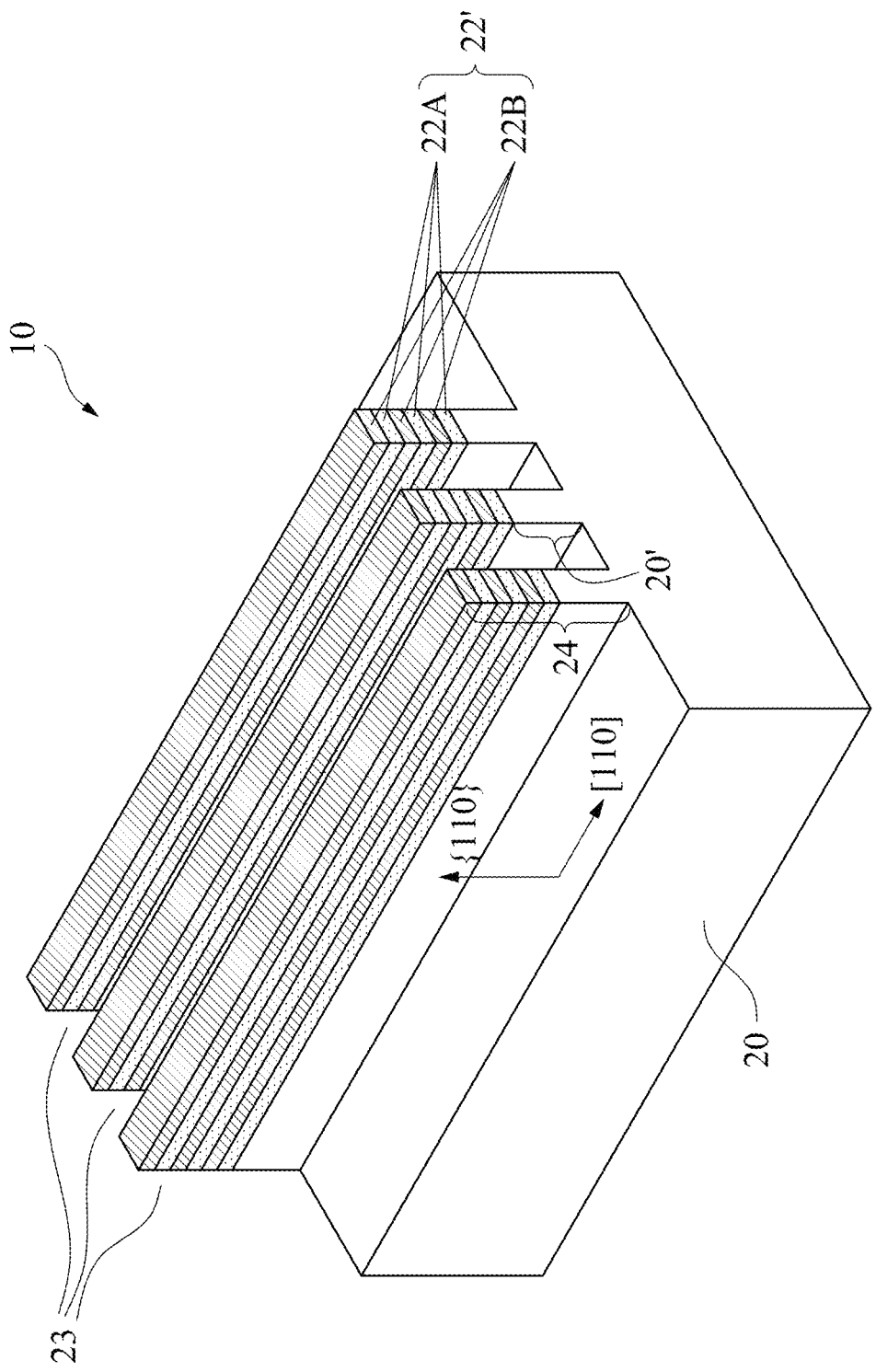

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 21. Trenches 23 extend into substrate 20. The remaining portions of multilayer stacks are referred to as multilayer stacks 22' hereinafter. Multilayer stacks 22' may have their lengthwise directions in a [110] direction of the lattice structures of substrate 20 and multilayer stacks 22. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
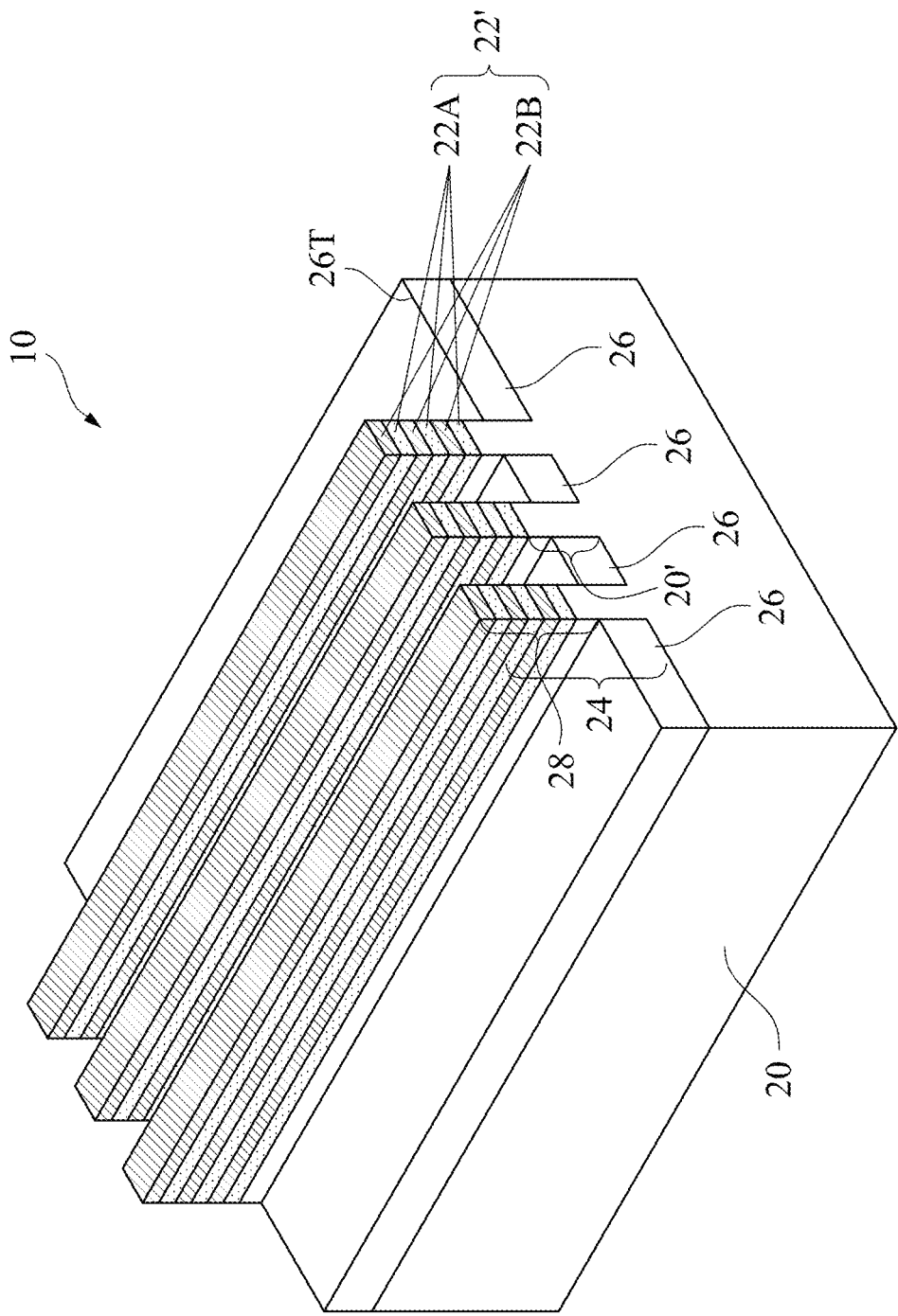

FIG. 3 illustrates the formation of isolation regions 26, which are also referred to as Shallow Trench Isolation (STI) regions throughout the description. The respective process is illustrated as process 206 in the process flow 200 shown in FIG. 21. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
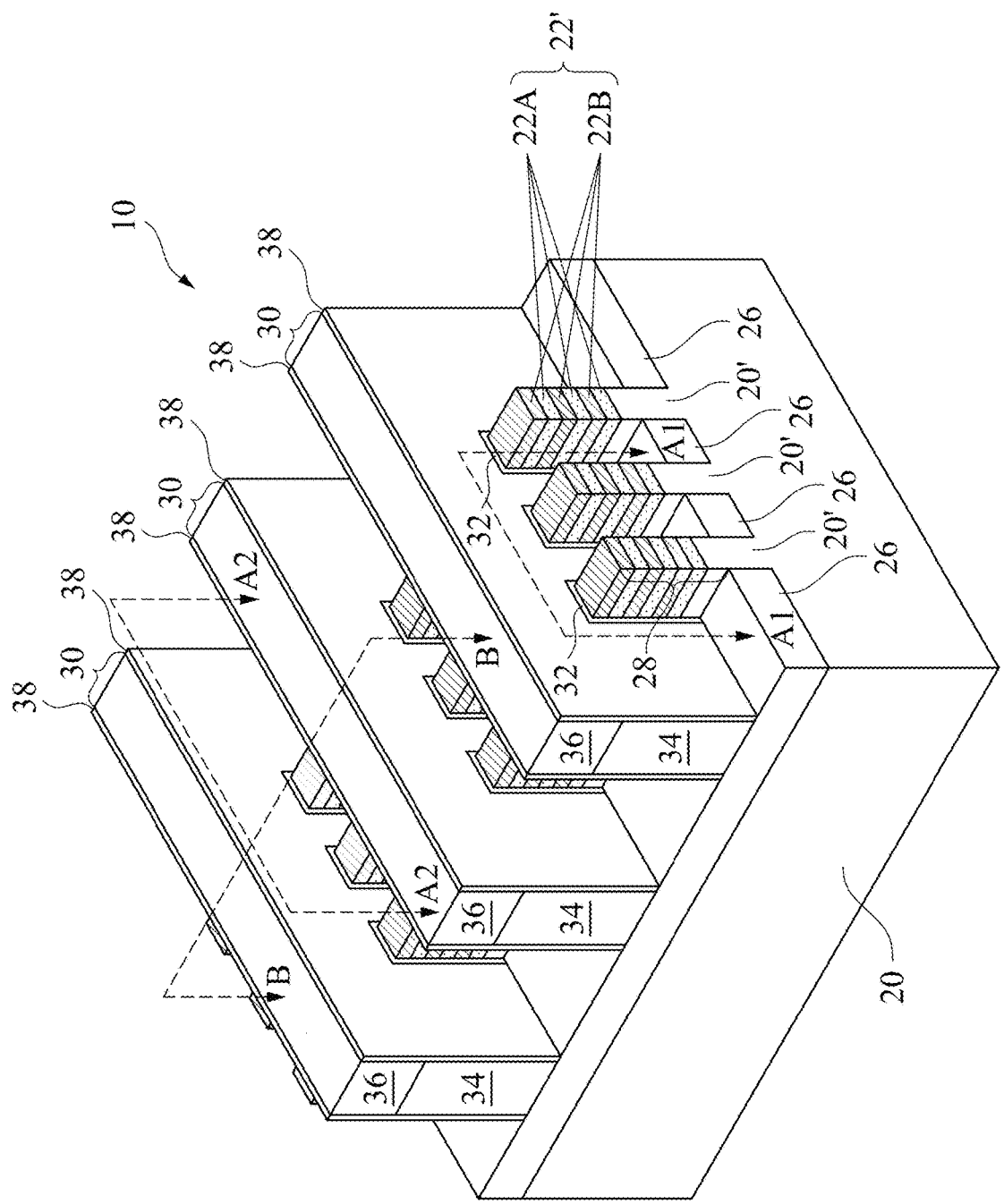

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 21. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a pattering process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
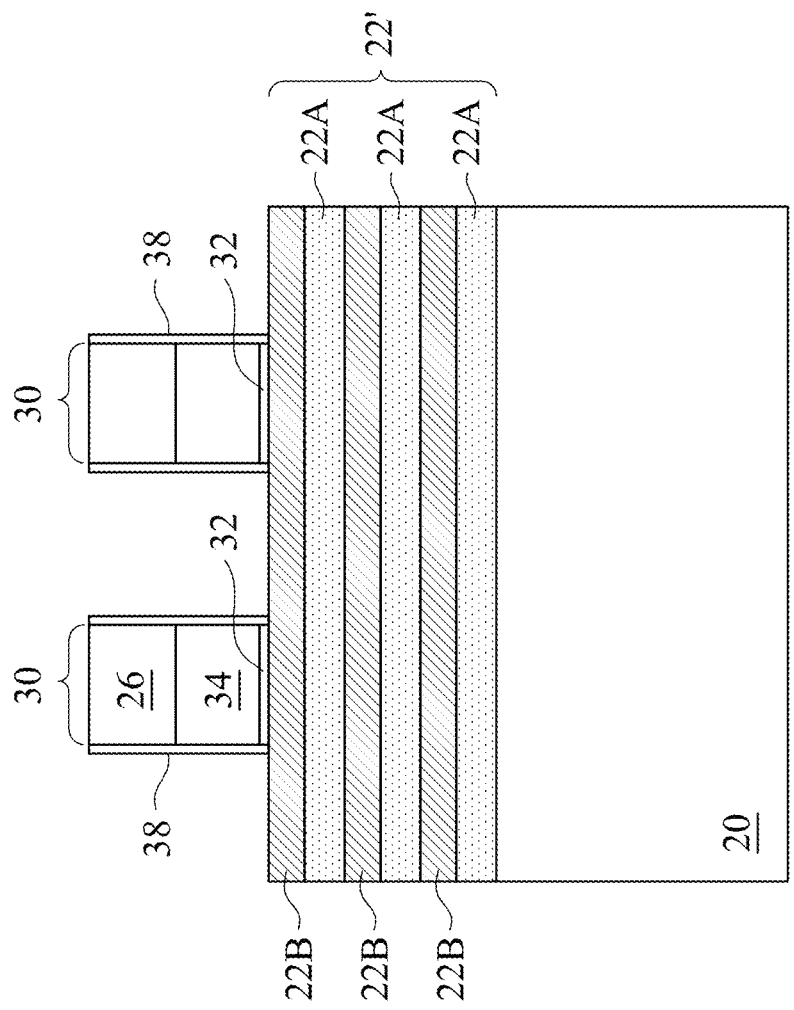
Figure 5A:
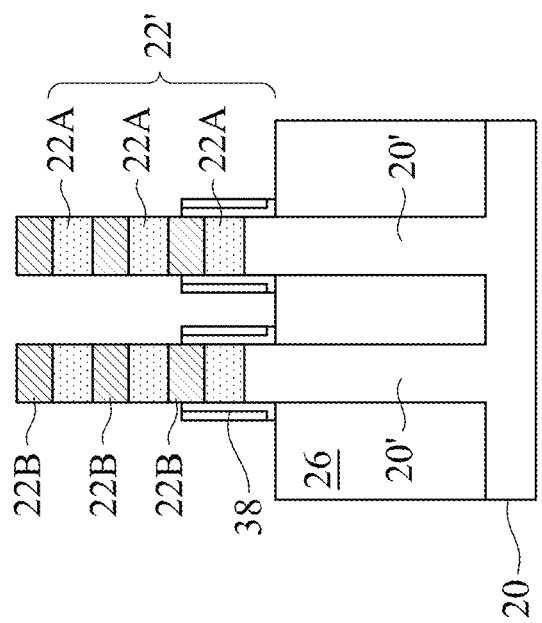

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by dummy gate stacks 30 and gate spacers 38, and is perpendicular to the gate-length direction. Fin spacers 38, which are on the sidewalls of protruding fins 28, are also illustrated. FIG. 5B illustrates the reference cross-section B-B in FIG. 4, which reference cross-section is parallel to the lengthwise directions of protruding fins 28.

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 21. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 21. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

FIGS. 8A and 8B illustrate the formation of inner spacers 44. The respective process is illustrated as process 214 in the process flow 200 shown in FIG. 21. The formation process incudes depositing a spacer layer extending into recesses 41, and performing an etching process to remove the portions of inner spacer layer outside of recesses 41, thus leaving inner spacers 44 in recesses 41. Inner spacers 44 may be formed of or comprise SiOCN, SiON, SiOC, SiCN, or the like. Inner spacers 44 may also be porous so that they have a lower-k value lower than, for example, about 3.5. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 8C:
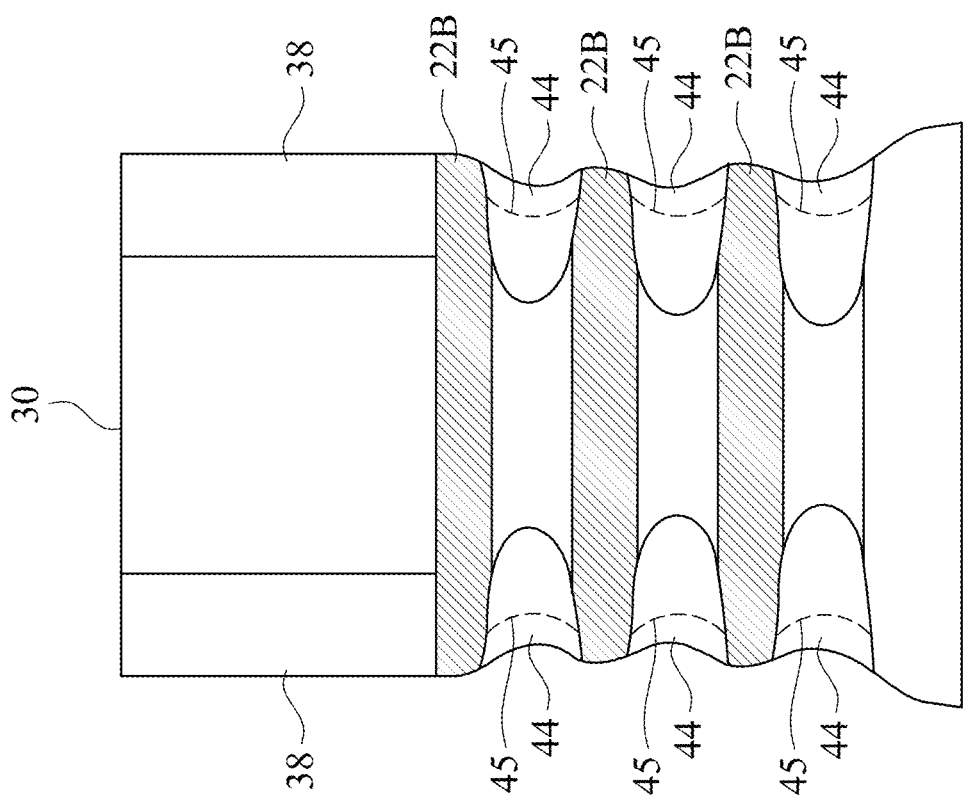

Although the inner sidewalls and the out sidewalls of the inner spacers 44 are schematically illustrated as being straight in FIG. 8B, the outer sidewalls of the inner spacers 44 may be concave or convex. As an example, FIG. 8C illustrates an amplified view of an embodiment in which sidewalls of sacrificial layers 22A are concave, outer sidewalls of the inner spacers 44 are concave, and the inner spacers 44 are recessed from the corresponding sidewalls of nano structures 22B. In accordance with some embodiments, some of the top surfaces and bottom surfaces at the corners of nanostructures 22B may be exposed, for example, when the exposed surfaces of inner spacers 44 are at the positions marked by dashed lines 45. The exposing of the top and bottom surfaces at corners of nanostructures 22B may help to increase the thickness of epitaxy layer 48-1 (FIG. 9B) at corners. This may be achieved by over-etching the inner spacer layer. The inner spacers 44 may be used to prevent the damage to subsequently formed source/drain regions (such as the epitaxial source/drain regions 48), which damage may be caused by subsequent etching processes (FIG. 13B) for forming replacement gate structures.

In a subsequent process, a pre-clean process may be performed to remove the oxide formed on the surface of semiconductor materials including nano structures 22B and substrate 20. The respective process is illustrated as process 216 in the process flow 200 shown in FIG. 21. The pre-clean process may be performed using SiCONi ($NF_3$ and $NH_3$), Certas (HF and $NH_3$), HF (gas), a HF solution, or the like. Inner spacers 44, with the existence of cross-bonds Si—O—

Si, are more resistant to the pre-clean process (than related dielectric materials with similar k values).

Figures 9A, 9B:
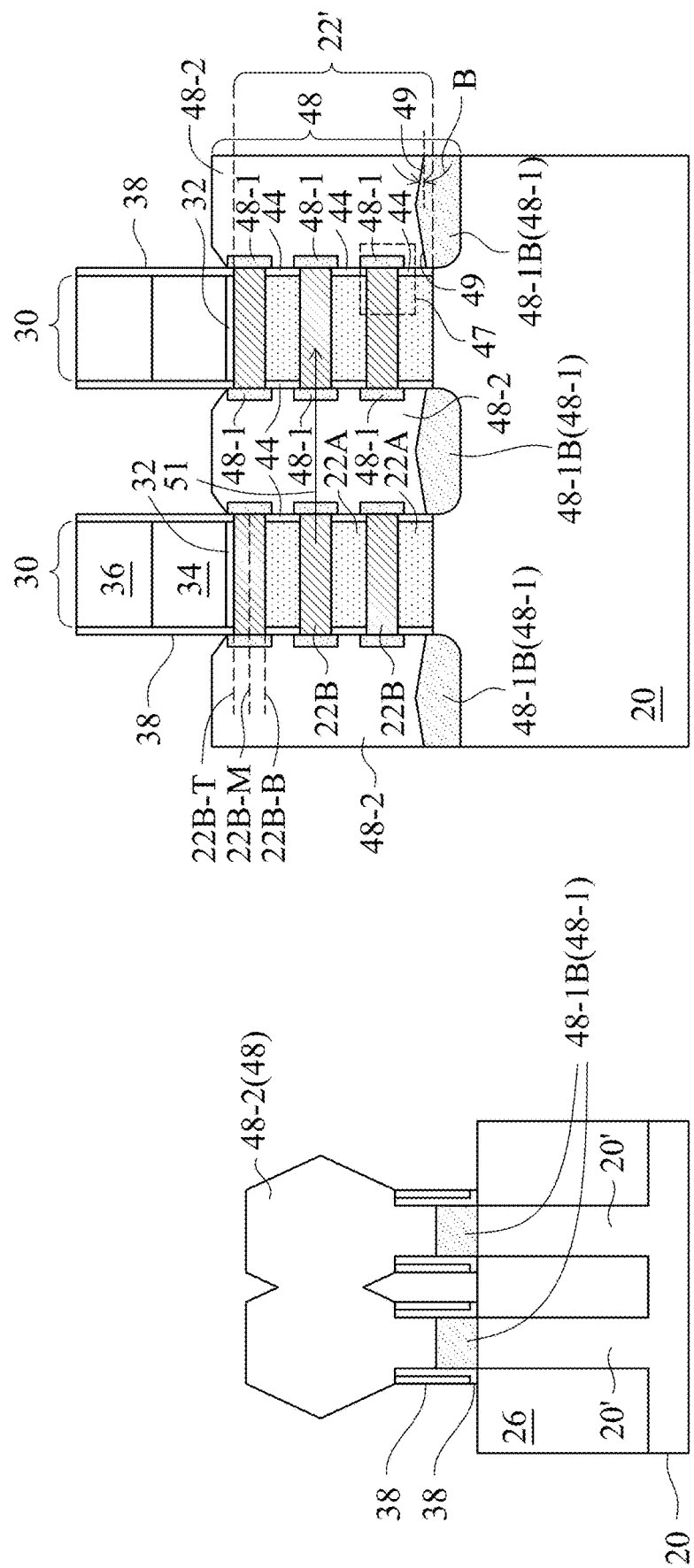

FIGS. 9A and 9B illustrate the processes for depositing epitaxy region(s) 48, which includes epitaxy layers 48-1 and 48-2. The first epitaxy layer 48-1 (which is also referred to as epitaxy layer L1) is epitaxially grown from the exposed semiconductors including the sidewalls of nanostructures 22B and the top surface of substrate 20. The respective process is illustrated as process 218 in the process flow 200 shown in FIG. 21. In the below-discussed example, n-type source/drain regions are discussed as an example. The concept may also be applied to p-type source/drain regions. The details of p-type source/drain regions are similar to that of the n-type source/drain regions, except that phosphorous may be replaced with boron, and SiAs, SiP, or SiCP may be replaced with SiGeB or SiB.

In accordance with some embodiments, epitaxy layer 48-1 is formed of or comprises SiAs. Arsenic has a low diffusion rate, and hence may be used for reducing the diffusion of the n-type impurity into the channels (nanostructures 22B). In accordance with alternative embodiments, epitaxy layer 48-1 is formed of or comprises SiP. The dopant concentration of As or P may be in the range between about $5 \times 10^{19}/cm^3$ and about $5 \times 10^{21}/cm^3$.

In accordance with yet alternative embodiments, epitaxy layer 48-1 is formed of or comprises SiCP. Carbon has the effect of retarding the diffusion of n-type dopants such as P and As. The carbon concentration is selected to be not too high and not too low. When the carbon concentration is too high such as greater than $1.5 \times 10^{21}/cm^3$, the resistance of epitaxy layer 48-1 is increased, and the performance of the resulting transistor is degraded. When the carbon concentration is too low such as lower than $5 \times 10^{19}/cm^3$, the retarding effect is not adequate. Accordingly, the carbon concentration may be in the range between about $5 \times 10^{19}/cm^3$ and about $1.5 \times 10^{21}/cm^3$. The phosphorous concentration is also selected to be not too high and not too low. When the phosphorous concentration is too high such as greater than $1.5 \times 10^{21}/cm^3$, too much phosphorous is diffused into the channels, and hence the short-channel effect is scarified. When the phosphorous concentration is too low such as lower than $5 \times 10^{19}/cm^3$, the resistance of epitaxy layer 48-1 is too high. Accordingly, the concentration of phosphorous may be in the range between about $5 \times 10^{19}/cm^3$ and about $1.5 \times 10^{21}/cm^3$.

In accordance with some embodiments, the deposition of epitaxy layer 48-1 is performed using Chemical Vapor Deposition (CVD), Molecular beam epitaxy (MBE), Reduced pressure Chemical Vapor Deposition (RPCVD), Plasma Enhanced Chemical Vapor Deposition (PECVD), or the like.

The process gas for depositing epitaxy layer 48-1 may include a silicon-containing gas, a dopant-containing gas containing As or P, and may or may not include a carbon-containing gas, depending whether SiP, SiAs, or SiCP is formed. The silicon-containing gas may include silane ($SiH_4$), disilane ($Si_2H_6$), trisilane ($Si_3H_8$), dichlorosilane (DCS, $SiH_2Cl_2$), trichlorosilane ($SiHCl_3$), silicon tetrachloride ($SiCl_4$), or the like, or combinations thereof. The dopant-containing process gas may include $PH_3$, phosphorous trichloride ($PCl_3$), or the like when phosphorous is added. The dopant-containing process gas may include $AsH_3$, tetiarybutylarsine ($C_4H_{11}As$), or the like when arsenic is added. The carbon-containing gas may include methyl silane ($SiCH_6$) or the like. The flow rate of the silicon-containing gas may be in the range between about 200 sccm and about 1,000 sccm. The flow rate of the phosphorous-containing gas (or the arsenic-containing gas) may be in the range between about 50 sccm and about 500 sccm. The chamber pressure may be in the range between about 100 Torr and about 300 Torr.

An etching gas such as HCl, chlorine ($Cl_2$), or the like is added into the process gas to achieve selective deposition of epitaxy layer 48-1 on exposed semiconductors, but not on dielectrics. The flow rate of the etching gas may be in the range between about 50 sccm and about 200 sccm.

The epitaxy time for growing epitaxy layer 48-1 to a desirable thickness (as will be discussed in subsequent paragraphs) cannot be too long or too short. Alternatively stated, the growth rate (increase in thickness per unit time) may not be too high or too low. When the growth rate is too high, the selectivity, which is the ratio of the growth rate of epitaxy layer 48-1 on nanostructures 22B to the growth rate on the exposed dielectrics (such as inner spacers 44) is too low, and unwanted nucleation may occur on inner spacers 44. When the grow rate is too low, the throughput is too low. Accordingly, the epitaxy time for growing epitaxy layer 48-1 is in the range between about 100 seconds and about 500 seconds.

Figure 9C:
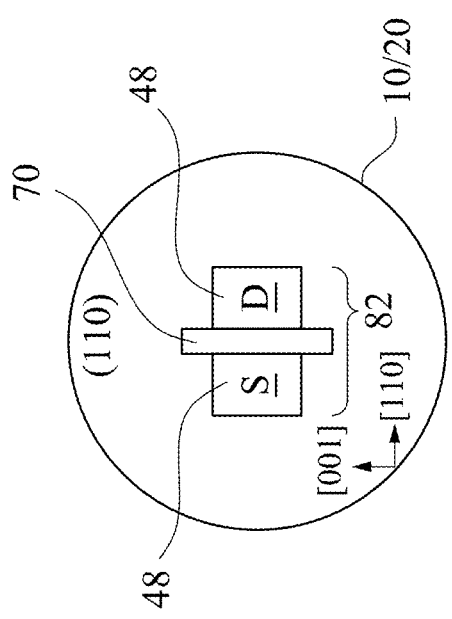
Figures 17A, 17B:
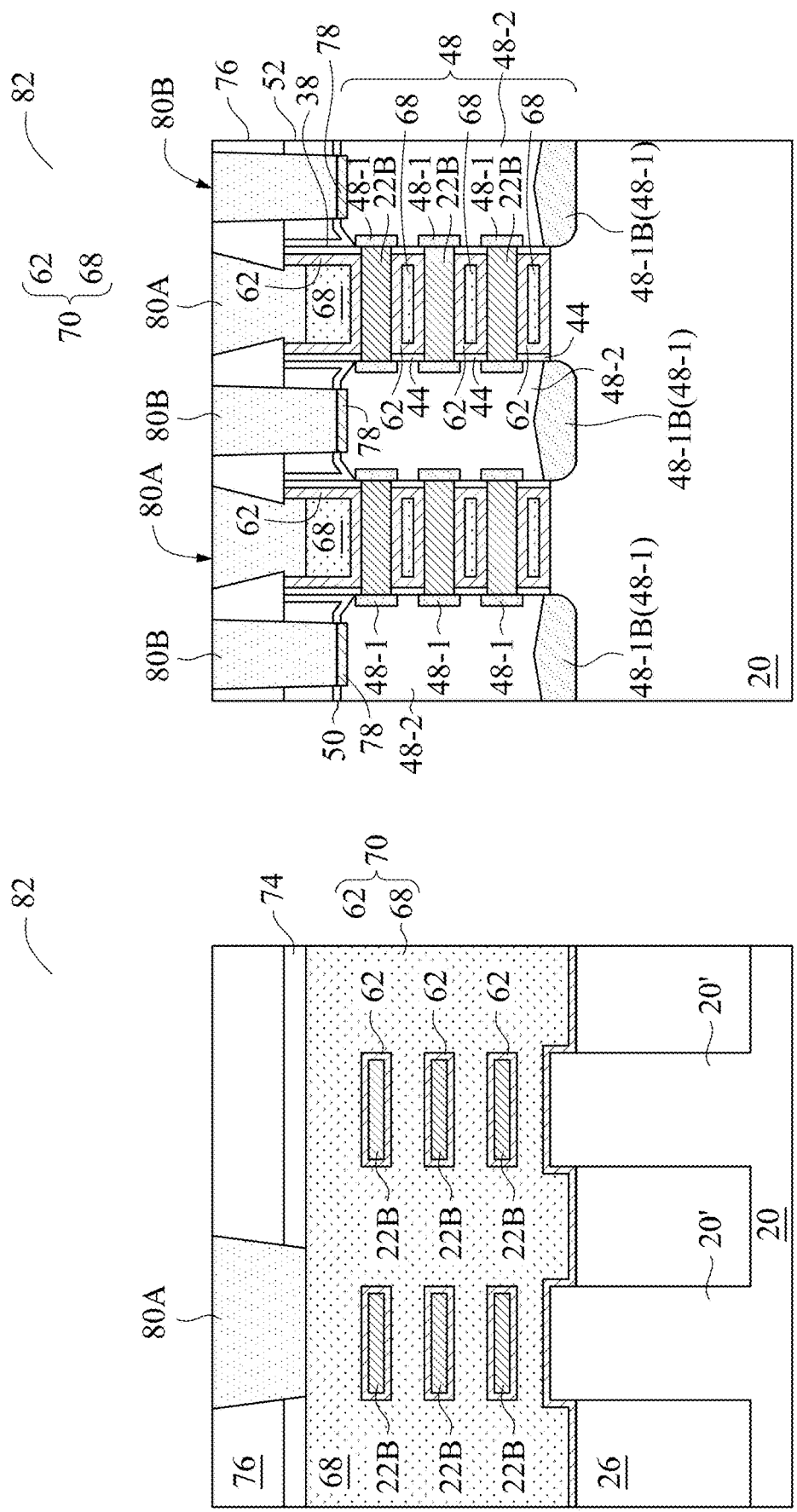
Figure 17C:
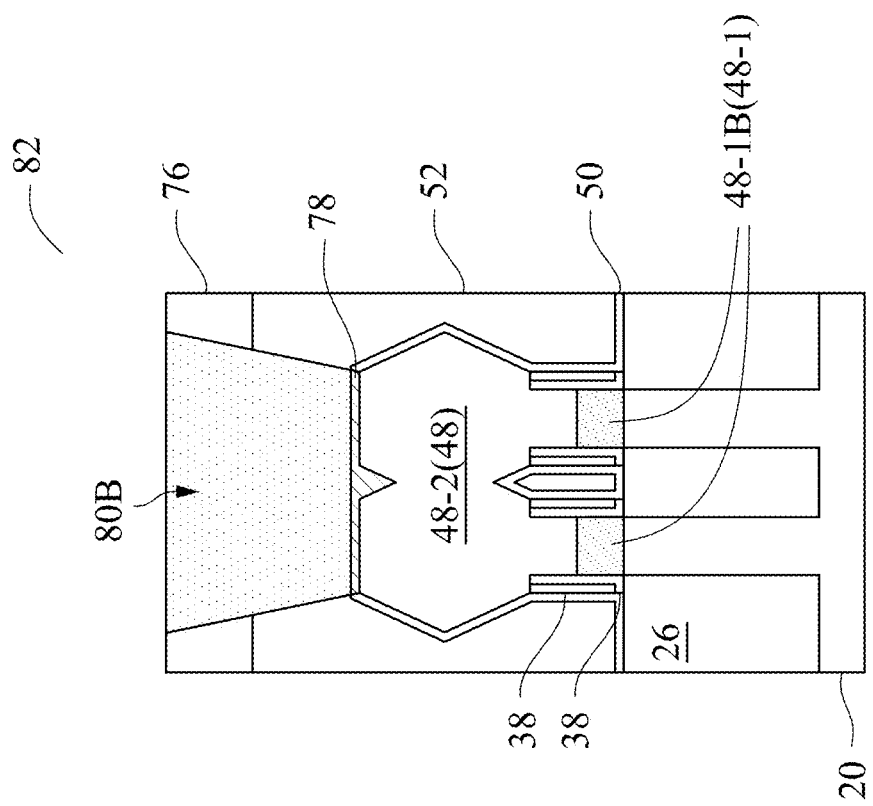

FIG. 9C illustrates a top view of a portion of wafer 10 and the respective transistor 82 (FIGS. 17A, 17B, and 17C). The substrate 20 of wafer 10 is a {110} substrate, with the top surface of substrate 20 being on {110} plane, which includes (110) plane and a family of its equivalent planes. Accordingly, the direction perpendicular to the top surface of substrate 20 is a [110] direction. The channel length direction of the transistor, which channel length direction is source-to-drain or drain-to-source, is a [110] direction of its equivalent directions. The channel width direction, which is in the lengthwise direction of the gate electrode, is a [001] direction or its equivalent directions including [100], [010], and [001] directions.

Figure 9D:
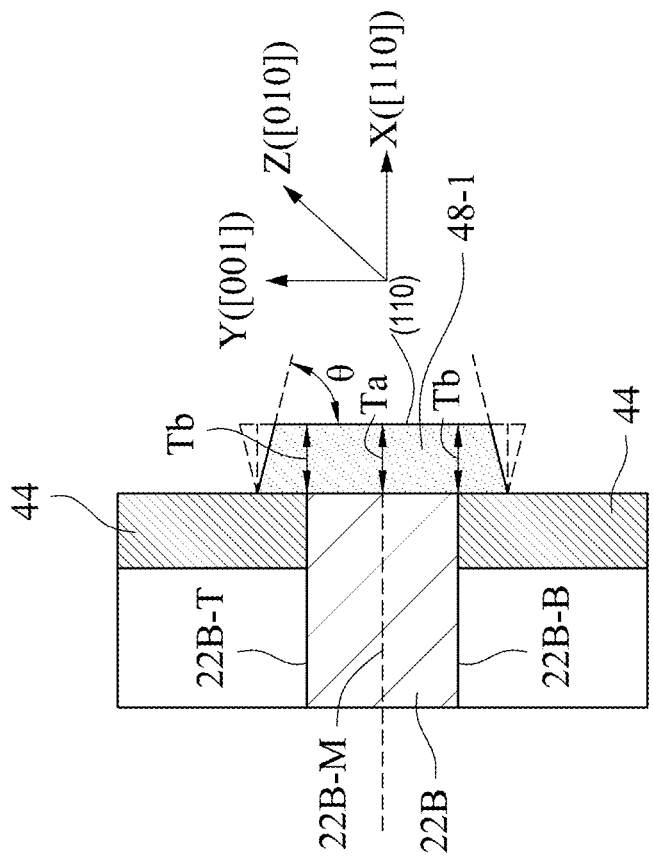

FIG. 9D illustrates a magnified view of a portion 47 of the structure shown in FIG. 9B. As shown in FIG. 9D, epitaxy layer 48-1 is grown starting from the sidewall of nanostructure 22B in the [110] direction (or one of its equivalent direction). Due to the lattice direction as shown in FIG. 9B, epitaxy layer 48-1 has a quadrilateral shape. In accordance with some embodiments, the outer edge (the right edge in the illustrated example in FIG. 9D) is on a (110) plane, and is a substantially straight-and-vertical edge.

In accordance with some embodiments, epitaxy layer 48-1 may be a trapezoid, with the inner edge (the edge contacting nanostructure 22B) being longer than the corresponding outer edge, which is the illustrated right edge. In accordance with alternative embodiments, epitaxy layer 48-1 may be a trapezoid, with the inner edge (the edge contacting nanostructure 22B) being shorter than the corresponding outer edge. The corresponding epitaxy layer 48-1 is shown using dashed lines. In accordance with yet alternative embodiments, epitaxy layer 48-1 has a rectangular shape in the cross-sectional view, as also represented by dashed lines. The tilt angle θ may be in the range between about 70 degrees and about 100 degrees. The cross-sectional view shape of epitaxy layer 48-1 may be controlled by adjusting the flow rate of the etching gas, and by adjusting the growth rate of epitaxy layer 48-1. For example, when the flow rate (referred to as a first flow rate) of the etching gas is increased, the nucleation of epitaxy layer 48-1 on inner spacers 44 is harder and slower, and the inner edge is shorter compared to the outer edge. Conversely, when the flow rate (referred to as a second flow rate) of the etching gas is reduced, the nucleation of epitaxy layer 48-1 on inner spacers 44 is easier and faster, and the inner edge is longer compared to the outer edge. When the flow rate of the etching gas is adjusted to a selected value between the first flow rate and the second flow rate, the shape of the epitaxy layer 48-1 may be adjusted to a rectangular shape.

As shown in FIG. 9D, nanostructure 22B (the future channel) includes top surface level 22B-T, bottom surface level 22B-B, and the middle level 22B-M in the middle between top surface level 22B-T and bottom surface level 22B-B. The thicknesses of epitaxy layer 48-1 measured at top surface level 22B-T, bottom surface level 22B-B, and the middle level 22B-M are denoted as a top thickness, a bottom thickness, and a middle thickness, respectively. The top thickness may be equal to the bottom thickness, and hence both are denoted as thicknesses Tb. The middle thickness is denoted as Ta. Thicknesses Ta and Tb may be in the range between about 2 nm and about 8 nm.

Thicknesses Ta and Tb are equal to or substantially equal to each other, for example, with a difference being smaller than about 1 nm. The difference (Ta−Tb), which is referred to as thickness loading c, is controlled to be as small as possible. Furthermore, the ratio (Ta−Tb)/Ta is controlled to be smaller than 0.5, and may be smaller than about 0.25. Controlling thickness loading c to be small may reduce junction leakage. This is because the doping concentration in epitaxy layer 48-1 is low, and epitaxy layer 48-1 has the function of reducing junction leakage. With epitaxy layer 48-1 having a uniform thickness, epitaxy layer 48-1 does not have a weak part that is too thin and the junction leakage of the weak part is too high.

Figure 19:
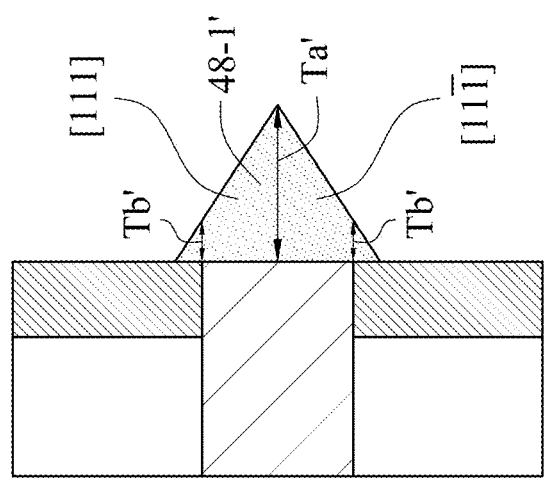
FIG. 19 illustrates a portion of a related structure.
Figure 20:
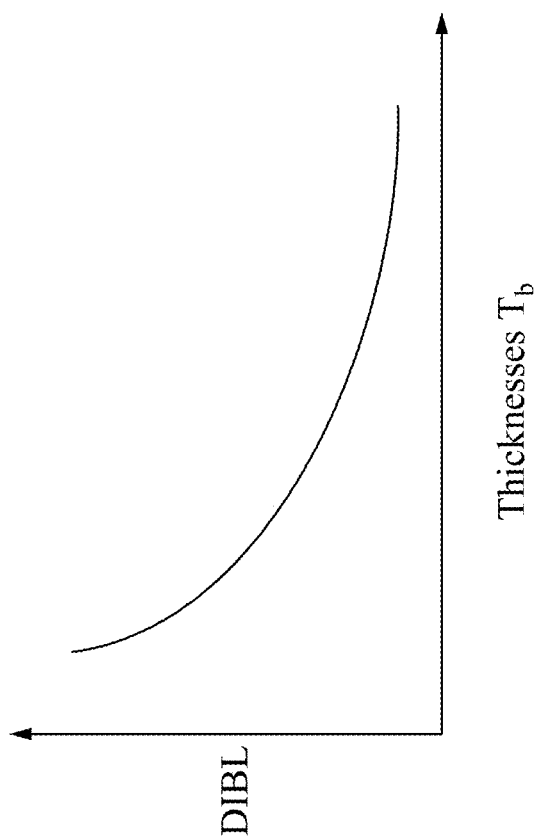
FIG. 20 schematically illustrates Drain-Induced-Barrier-Lowering (DIBL) as a function of the thickness of layer-1 in an epitaxy source/drain region in accordance with some embodiments.

As a comparison, FIG. 19 illustrates a related structure in which the epitaxy layer 48-1' has a triangular shape. Accordingly, the top and bottom thicknesses Tb' are small, and significant junction leakage may occur through these portions. In addition, the small thicknesses Tb' incur worse Drain-Induced-Barrier-Lowering (DIBL). For example, FIG. 20 schematically illustrates the DIBL as a function of the thickness Tb in accordance with some embodiments. It is shown that with the increase in the thickness of epitaxy layer 48-1, the DIBL advantageously reduces. On the other hand, if epitaxy layer 48-1 is too thick, the source/drain resistance increases, causing the degradation of the performance of the transistor. Accordingly, it is desirable to make the thickness of epitaxy layer 48-1 uniform. In the embodiments of the present disclosure, since thickness loading c is small, there is no significant weak point that causes the worsening of the DIBL also.

Referring back to FIG. 9B, epitaxy layer 48-1 further comprises a bottom portion 48-1B grown from the top surface of substrate 20. Bottom portion 48-1B has top surfaces 49, which are higher in middle and lower at edges. In the illustrated cross-sectional view, top surface 49 may comprise two straight portions joining to each other in the middle. The tilt angle β of the top surfaces 49, which is the angle between a top surface 49 and horizontal level, may be smaller than about 20 degrees, and may be between 0 degree and about 20 degrees.

Further referring to FIGS. 9A and 9B, a second epitaxy layer 48-2 (which is also referred to as epitaxy layer L2) is deposited. The respective process is illustrated as process 220 in the process flow 200 shown in FIG. 21. The process gas for depositing epitaxy layer 48-2 may include a silicon-containing gas, a phosphorous-containing gas, and an etching gas. These gases may be selected from the corresponding candidate groups of gases for forming epitaxy layer 48-1, and hence are not repeated herein. The flow rate of the silicon-containing gas may be in the range between about 500 sccm and about 1,000 sccm. The flow rate of the phosphorous-containing gas may be in the range between about 50 sccm and about 500 sccm, or higher. The flow rate of the etching gas may be in the range between about 50 sccm and about 200 sccm. The formation process may also be the same as discussed for epitaxy layer 48-1.

Epitaxy layer 48-2 fully fills the trenches 42 as shown in FIG. 8B, with the top surfaces being higher than the interfaces between dummy gate dielectrics 32 and the top nanostructure 22B. The epitaxy time for growing epitaxy layer 48-2 to the desirable height cannot be too long or too short. Alternatively stated, the growth rate may not be too high or too low. When the growth rate is too high, the selectivity, which is the ratio of the growth rate of epitaxy layer 48-2 on epitaxy layer 48-1 to the growth rate on the exposed dielectrics (such as inner spacers 44 and gate spacers 38) is too low, and unwanted nucleation on the dielectrics may occur. When the grow rate is too low, the throughput is too low. Accordingly, the epitaxy time for growing epitaxy layer 48-2 may be in the range between about 100 seconds and about 500 seconds in accordance with some embodiments.

Epitaxy layer 48-2 has a higher dopant concentration than epitaxy layer 48-1. In accordance with some embodiments, the concentration of phosphorous in epitaxy layer 48-2 may be greater than about $2\times10^{21}$, and may be in the range between about $2\times10^{21}/cm^3$ and about $1\times10^{22}/cm^3$.

On top of epitaxy layer 48-2, there may be, or may not be, additional epitaxy layers. For example, an additional epitaxy layer L3 (not shown) with a lower phosphorous concentration may be epitaxy grown. When the respective transistor is a p-type transistor, and when epitaxy layer 48-2 comprises SiGeB, the epitaxy layer L3 may be a SiB layer, or may be a SiGeB layer with a lower germanium atomic percentage than epitaxy layer 48-2. Throughout the description, epitaxy layers 48-1, 48-2, and the overlying epitaxy layers (if any) are collectively referred to as source/drain regions 48.

Figure 18:
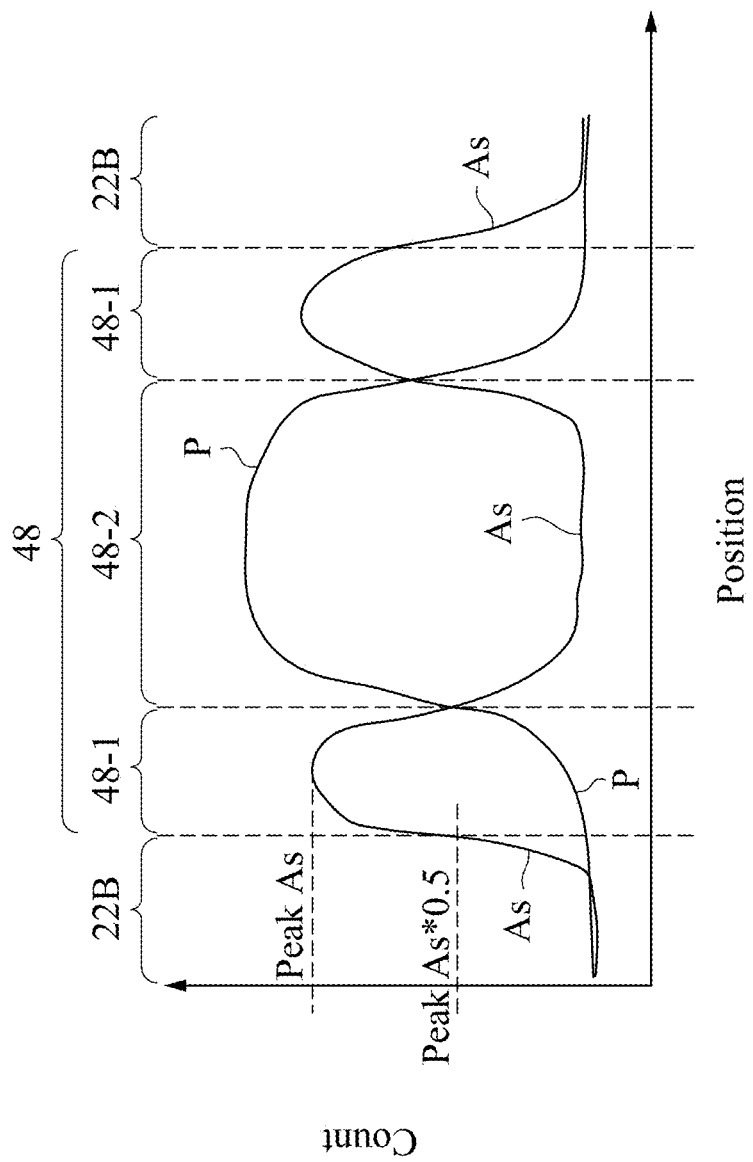
FIG. 18 illustrates the distribution of dopants in a source/drain region in accordance with some embodiments.

FIG. 18 illustrates the distribution of arsenic and phosphorous when epitaxy layer 48-1 comprises SiAs and epitaxy layer 48-2 comprises SiP or SiCP. The X-axis represents the position along arrow 51 in FIG. 9B. The Y-axis represents the relative count of As and P, which are obtained through Energy-Dispersive X-ray (EDX) analysis based on Transmission Electron Microscopy (TEM). The positions of nanostructures 22B, epitaxy layers 48-1, and epitaxy layer 48-2 are marked. The interface between epitaxy layers 48-1 and epitaxy layer 48-2 are defined as where the signal of arsenic drops to 50 percent of its peak value. Through this criterion, the interfaces between epitaxy layers 48-1 and epitaxy layer 48-2 may be identified.

The subsequent figure numbers in FIGS. 10A, 10B, and 10C through FIGS. 17A, 17B, and 17C may have the corresponding numbers followed by letter A, B, or C. The figure with the figure number having the letter A indicates that the corresponding figure shows a cross-section same as the cross-section A2-A2 in FIG. 4, the figure with the figure number having the letter B indicates that the corresponding figure shows a cross-section same as the cross-section B-B in FIG. 4, and the figure with the figure number having the letter C indicates that the corresponding figure shows a cross-section same as the cross-section A1-A1 in FIG. 4.

Figures 10A, 10B:
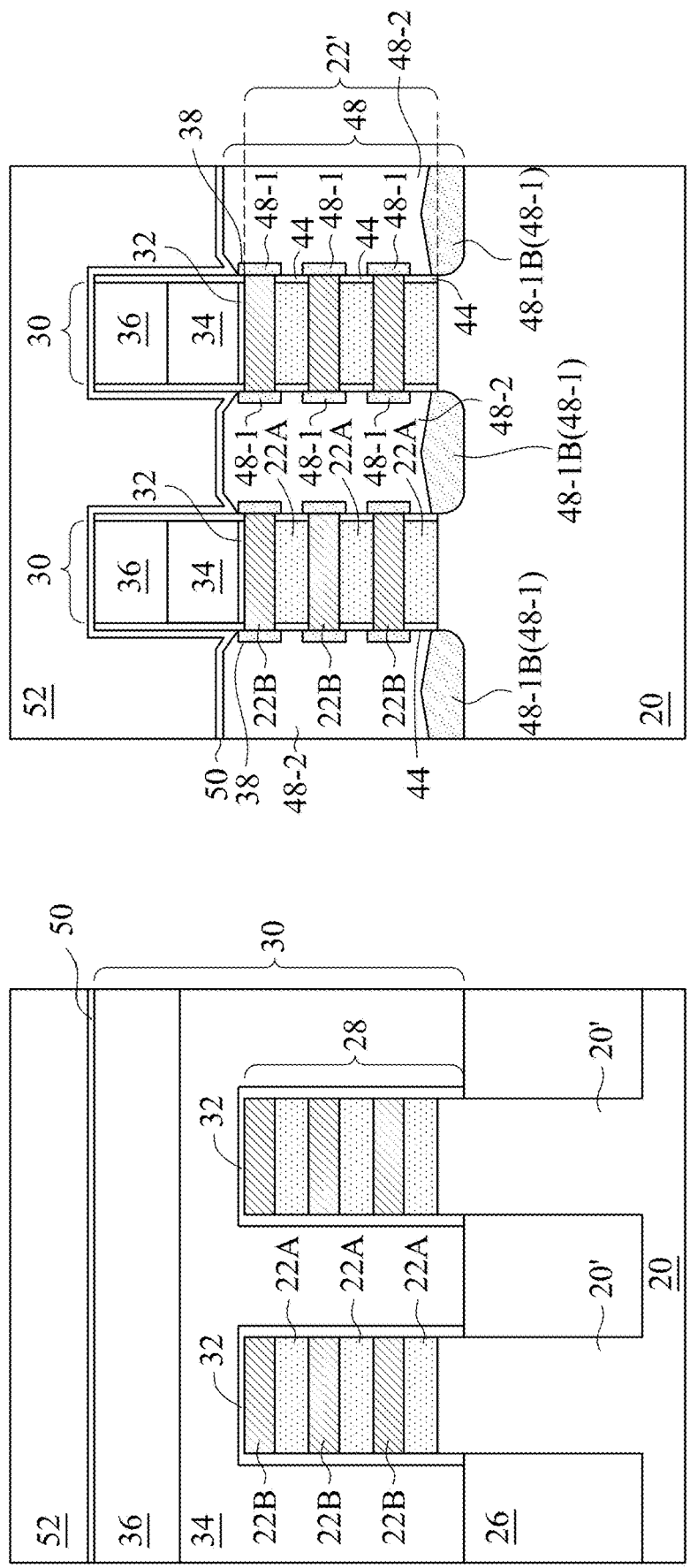
Figure 10C:
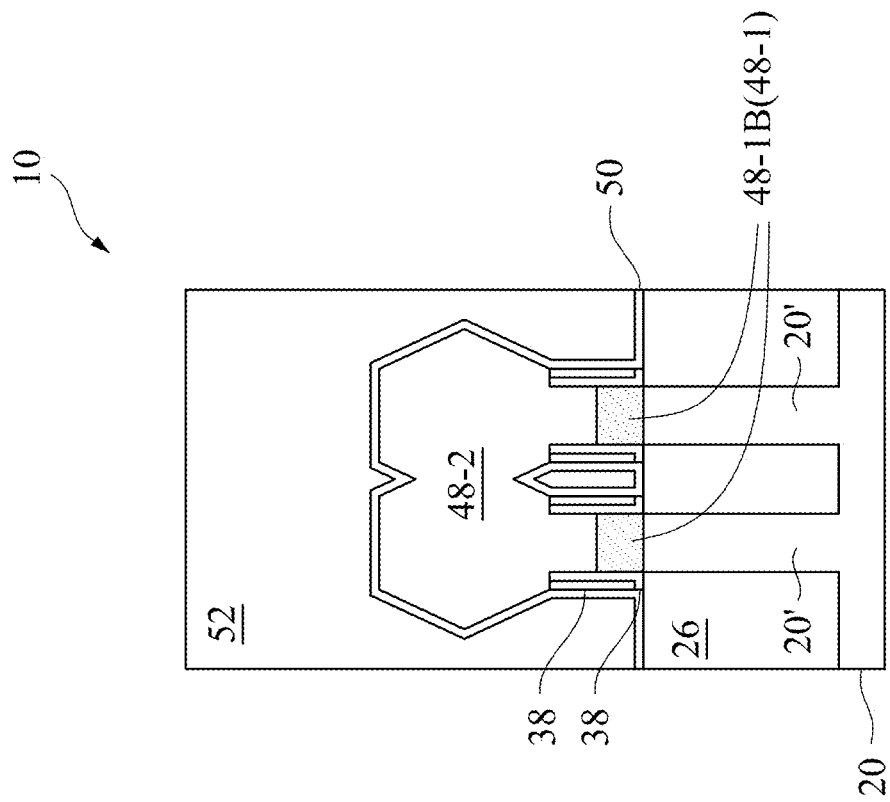

FIGS. 10A, 10B, and 10C illustrate the cross-sectional views of the structure after the formation of Contact Etch Stop Layer (CESL) 50 and Inter-Layer Dielectric (ILD) 52. The respective process is illustrated as process 222 in the process flow 200 shown in FIG. 21. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 11B:
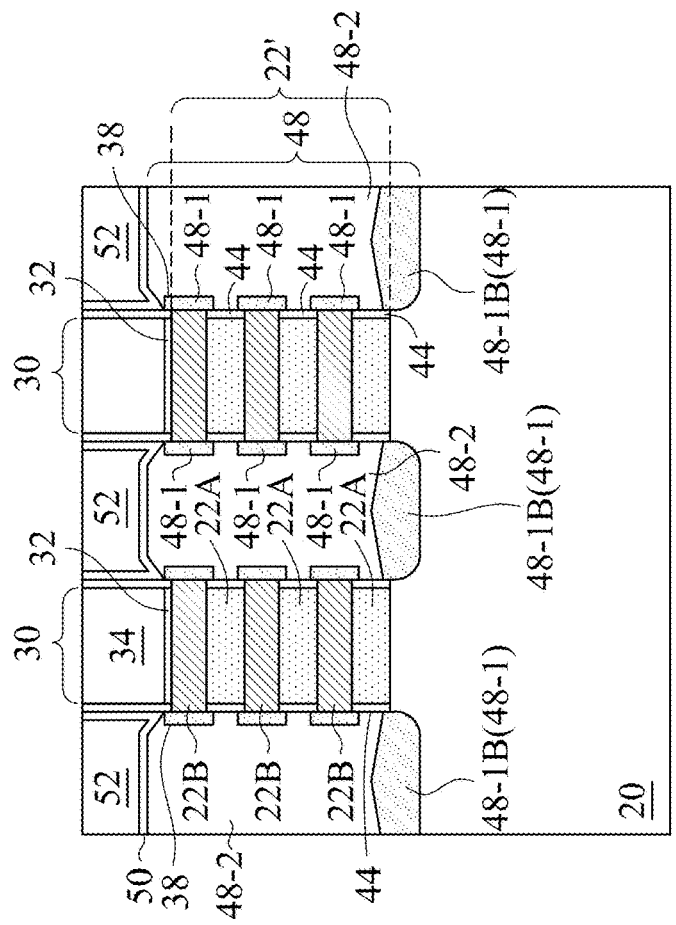
Figure 11A:
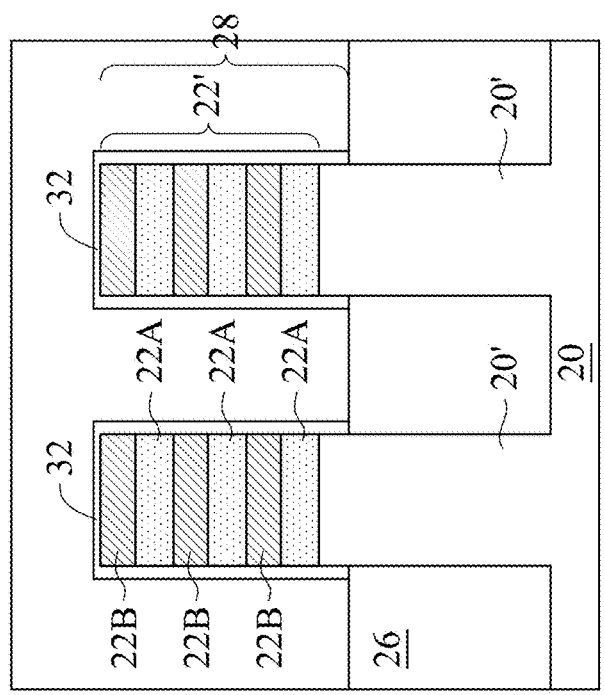

FIGS. 11A and 11B through FIGS. 15A and 15B illustrate the process for forming replacement gate stacks. In FIGS. 11A and 11B, a planarization process such as a CMP process or a mechanical grinding process is performed to level the top surface of ILD 52. The respective process is illustrated as process 224 in the process flow 200 shown in FIG. 21. In accordance with some embodiments, the planarization process may remove hard masks 36 to reveal dummy gate electrodes 34, as shown in FIG. 11B. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level within process variations.

Figures 12A, 12B:
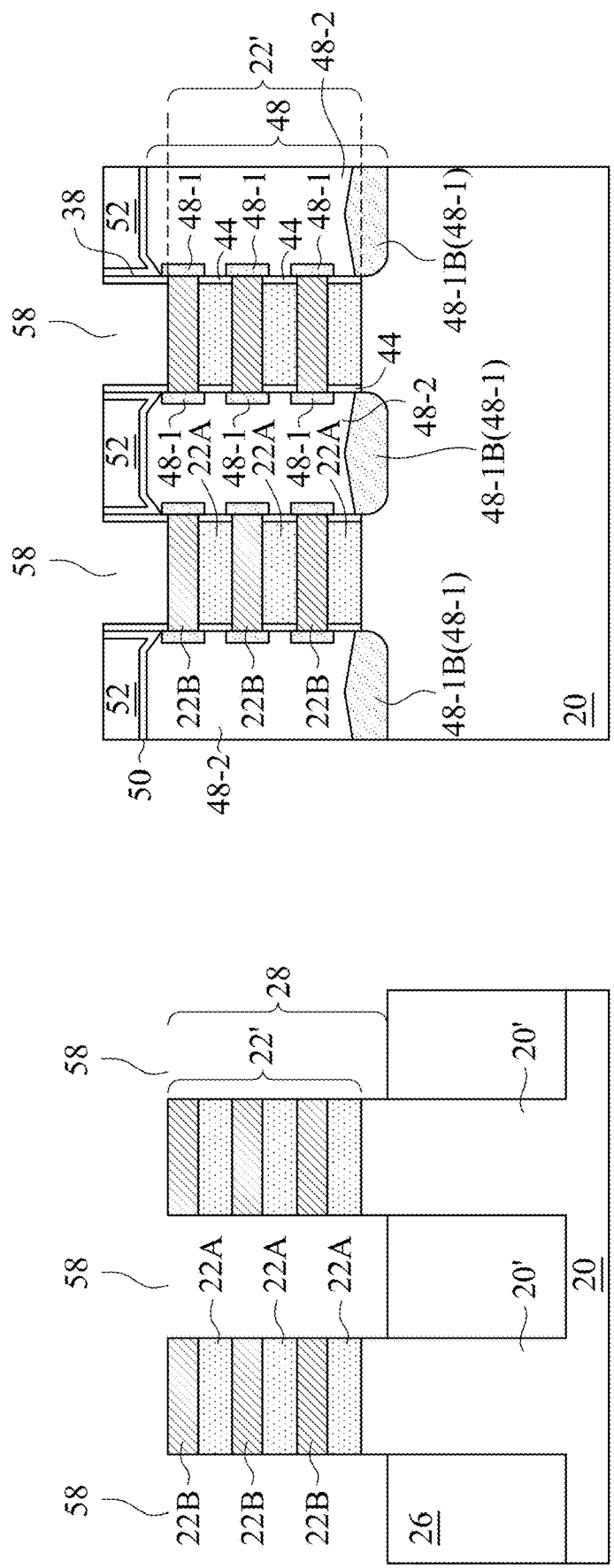

Next, dummy gate electrodes 34 (and hard masks 36, if remaining) are removed in one or more etching processes, so that recesses 58 are formed, as shown in FIGS. 12A and 12B. The respective process is illustrated as process 226 in the process flow 200 shown in FIG. 21. The portions of the dummy gate dielectrics 32 in recesses 58 are also removed. In accordance with some embodiments, dummy gate electrodes 34 and dummy gate dielectrics 32 are removed through an anisotropic dry etch process. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The portions of the multilayer stacks 22', are between neighboring pairs of the epitaxial source/drain regions 48.

Figure 13B:
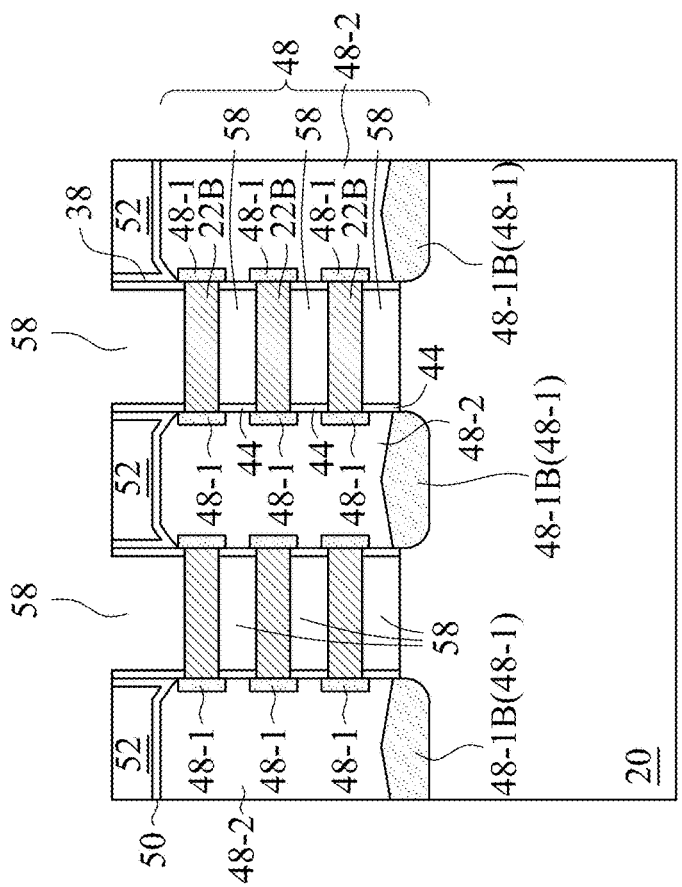
Figure 13A:
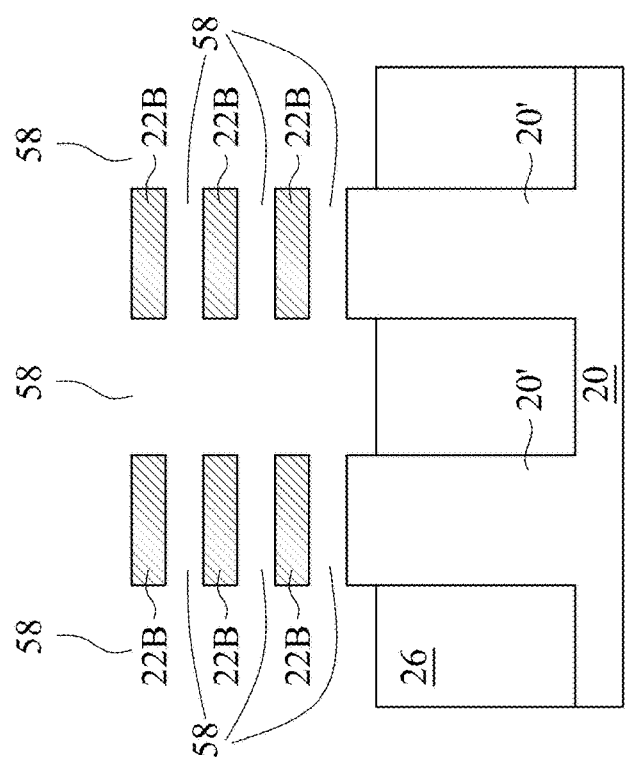

Sacrificial layers 22A are then removed to extend recesses 58 between nanostructures 22B, and the resulting structure is shown in FIGS. 13A and 13B. The respective process is illustrated as process 228 in the process flow 200 shown in FIG. 21. Sacrificial layers 22A may be removed by performing an isotropic etching process such as a wet etching process using etchants which are selective to the materials of sacrificial layers 22A, while nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or carbon-doped silicon, tetra methyl ammonium hydroxide (TMAH), ammonium hydroxide ($NH_4OH$), or the like may be used to remove sacrificial layers 22A.

Figure 14B:
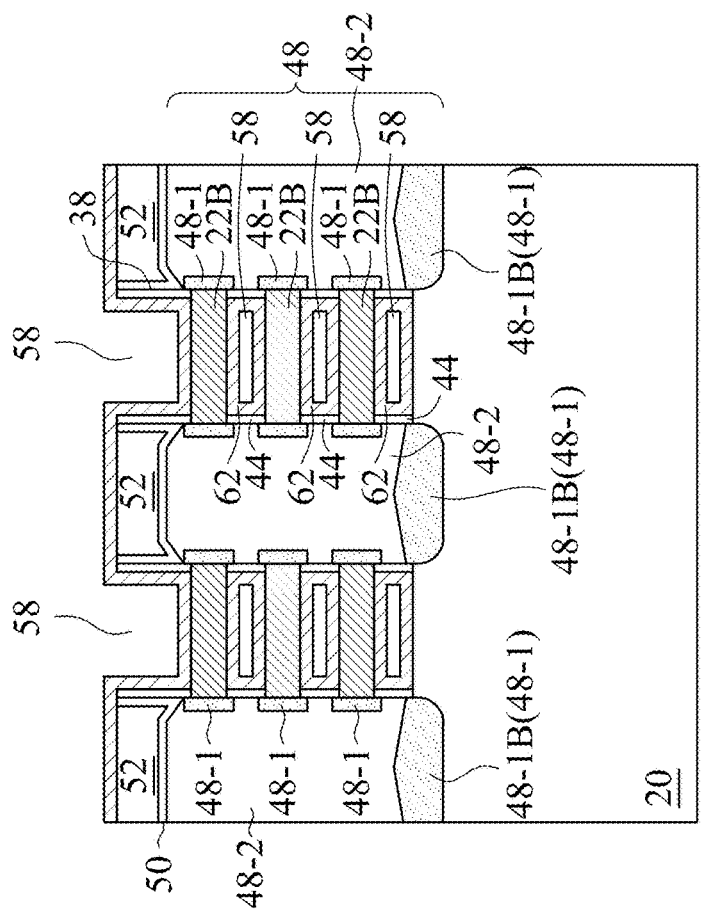
Figure 14A:
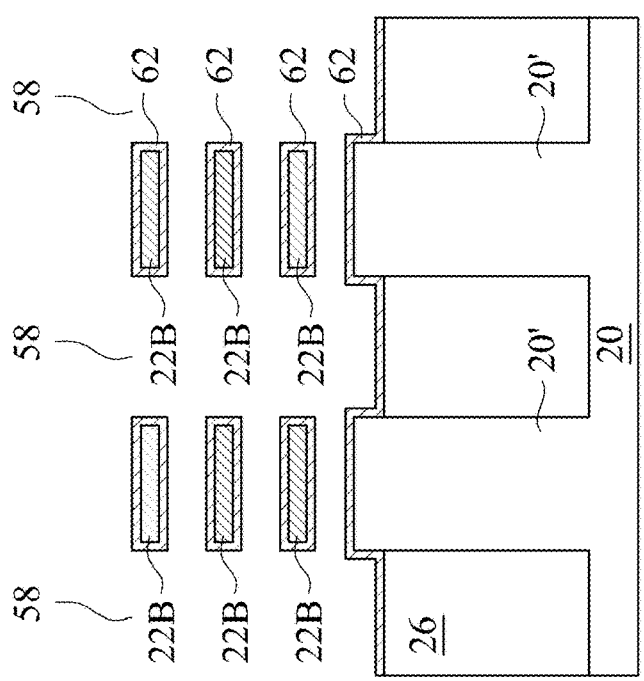

Referring to FIGS. 14A and 14B, gate dielectrics 62 are formed. The respective process is illustrated as process 230 in the process flow 200 shown in FIG. 21. In accordance with some embodiments, each of gate dielectrics 62 includes an interfacial layer and a high-k dielectric layer on the interfacial layer. The interfacial layer may be formed of or comprises silicon oxide, which may be deposited through a conformal deposition process such as ALD or CVD. In accordance with some embodiments, the high-k dielectric layers comprise one or more dielectric layers. For example, the high-k dielectric layer(s) may include a metal oxide or a silicate of hafnium, aluminum, zirconium, lanthanum, manganese, barium, titanium, lead, and combinations thereof.

Figures 15A, 15B:
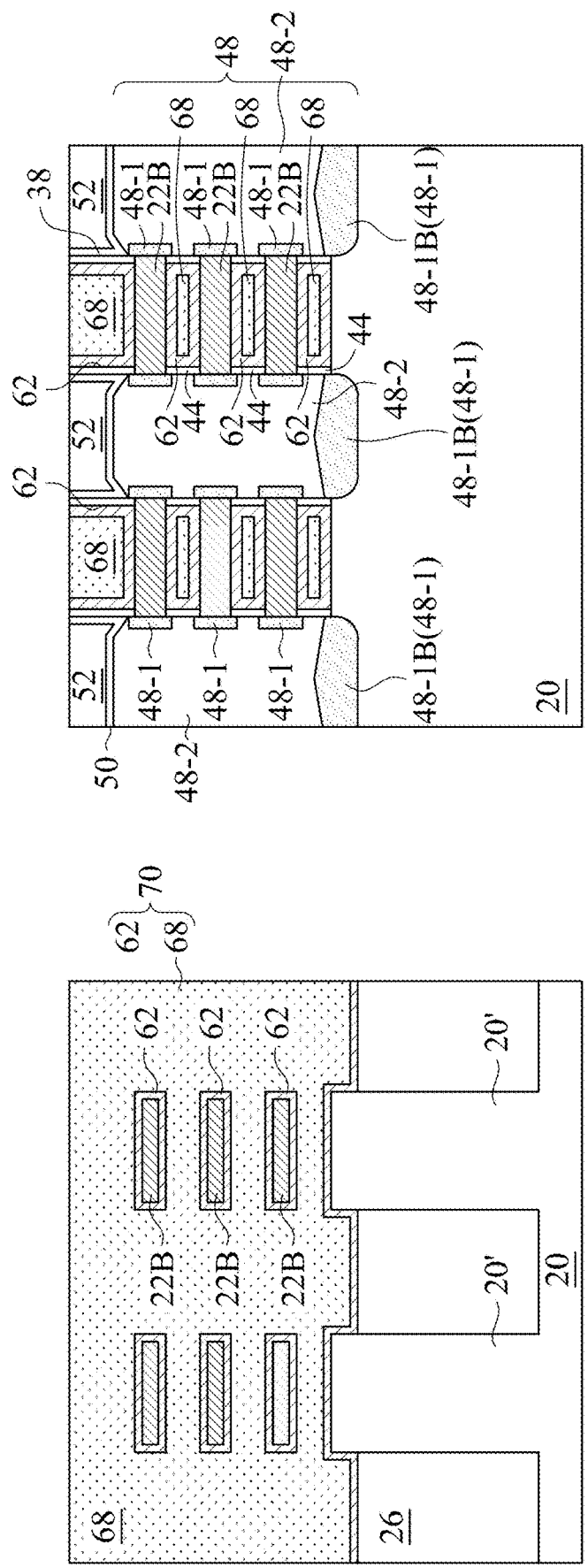

Referring to FIGS. 15A and 15B, gate electrodes 68 are formed. In the formation, conductive layers are first formed on the high-k dielectric layer, and fill the remaining portions of recesses 58. The respective process is illustrated as process 232 in the process flow 200 shown in FIG. 21. Gate electrodes 68 may include a metal-containing material such as TiN, TaN, TiAl, TiAlC, cobalt, ruthenium, aluminum, tungsten, combinations thereof, and/or multilayers thereof. For example, although single-layer gate electrodes 68 are illustrated in FIGS. 15A and 15B, gate electrodes 68 may comprise any number of layers, any number of work function layers, and possibly a filling material. Gate dielectrics 62 and gate electrodes 68 also fill the spaces between adjacent ones of nanostructures 22B, and fill the spaces between the bottom ones of nanostructures 22B and the underlying substrate strips 20'. After the filling of recesses 58, a planarization process such as a CMP process or a mechanical grinding process is performed to remove the excess portions of the gate dielectrics and the material of gate electrodes 68, which excess portions are over the top surface of ILD 52. Gate electrodes 68 and gate dielectrics 62 are collectively referred to as gate stacks 70 of the resulting nano-FETs.

Figure 16C:
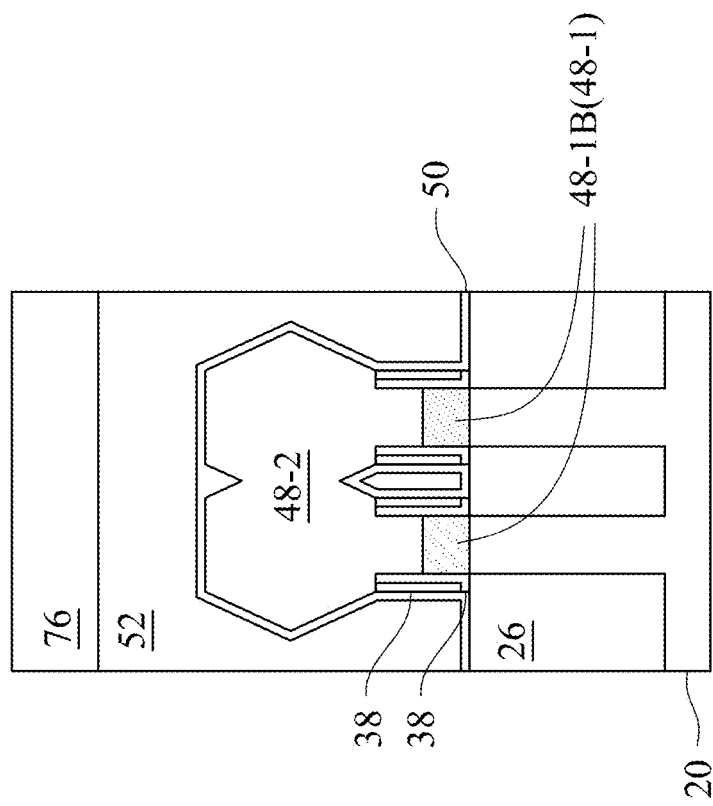

In the processes shown in FIGS. 16A, 16B, and 16C, gate stacks 70 are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 234 in the process flow 200 shown in FIG. 21.

As further illustrated by FIGS. 16A, 16B, and 16C, ILD 76 is deposited over ILD 52 and over gate masks 74. The respective process is illustrated as process 236 in the process flow 200 shown in FIG. 21. An etch stop layer (not shown), may be, or may not be, deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG, USG, or the like.

In FIGS. 17A, 17B, and 17C, ILD 76, ILD 52, CESL 50, and gate masks 74 are etched to form recesses (occupied by contact plugs 80A and 80B) exposing surfaces of the epitaxial source/drain regions 48 and/or gate stacks 70. The recesses may be formed through etching using an anisotropic etching process, such as RIE, NBE, or the like. In accordance with some embodiments, the recesses may be formed by etching-through ILD 76 and ILD 52 using a first etching process, etching-through gate masks 74 using a second etching process, and etching-through CESL 50 possibly using a third etching process. Although FIG. 17B illustrates that contact plugs 80A and 80B are in a same cross-section, in various embodiments, contact plugs 80A and 80B may be formed in different cross-sections, thereby reducing the risk of shorting with each other.

After the recesses are formed, silicide regions 78 (FIGS. 17B and 17C) are formed over the epitaxial source/drain regions 48. The respective process is illustrated as process 238 in the process flow 200 shown in FIG. 21. In accordance with some embodiments, silicide regions 78 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal anneal process to form silicide regions 78. The metal may include nickel, cobalt, titanium, tantalum, platinum, tungsten, or the like. The un-reacted portions of the deposited metal are then removed, for example, by an etching process.

Contact plugs 80B are then formed over silicide regions 78. Also, contacts 80A (may also be referred to as gate contact plugs) are also formed in the recesses, and are over and contacting gate electrodes 68. The respective processes are illustrated as process 240 in the process flow 200 shown in FIG. 21. Contact plugs 80A and 80B may each comprise one or more layers, such as a barrier layer, a diffusion layer, and a filling material. For example, in accordance with some embodiments, contact plugs 80A and 80B each includes a barrier layer and a conductive material, and are electrically coupled to the underlying conductive feature (for example, gate stacks 70 or silicide region 78 in the illustrated embodiment). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of ILD 76. Nano-FET 82 is thus formed.

Figures 17D, 17E:
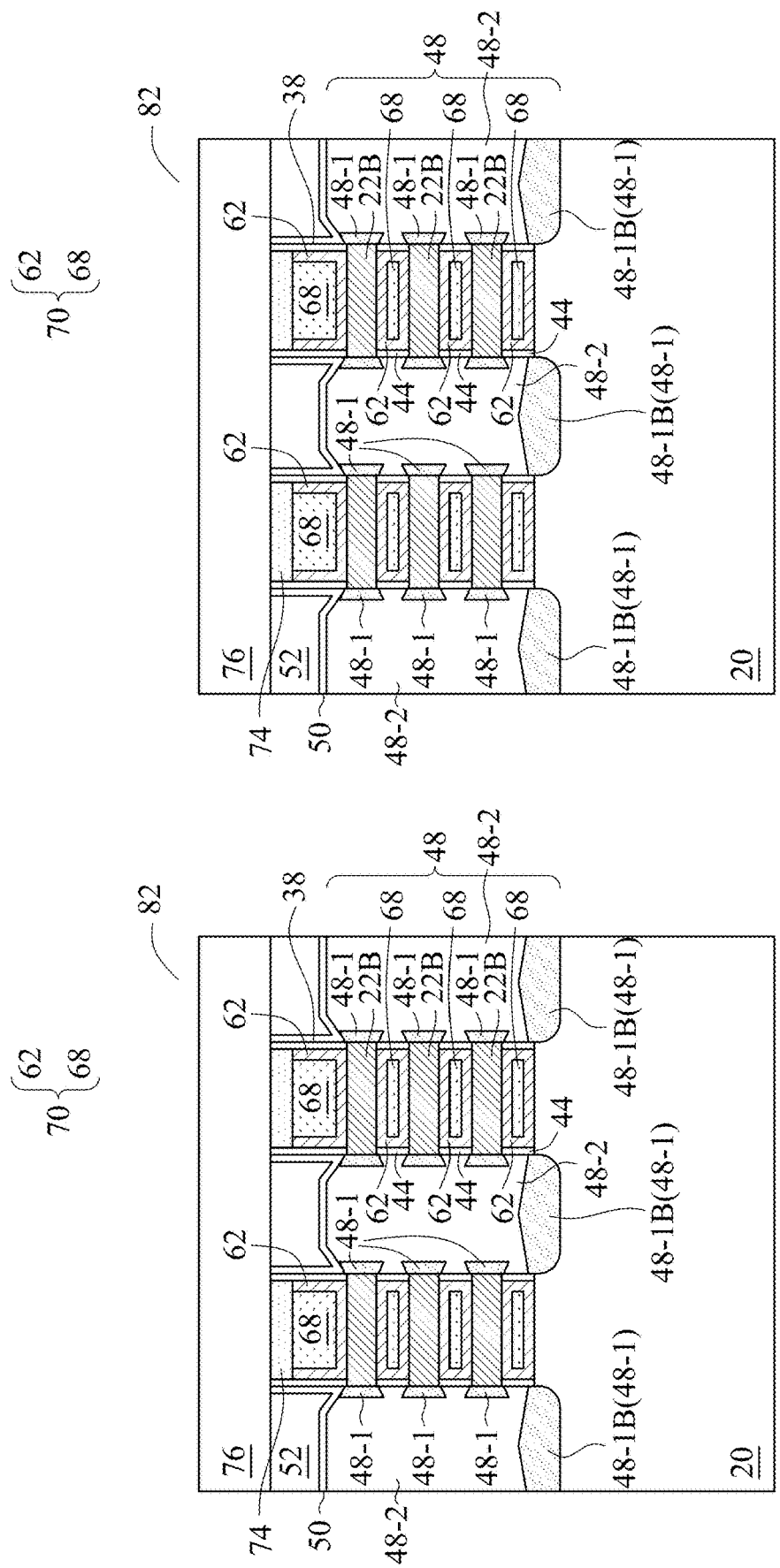

FIGS. 17D and 17E illustrate the GAA transistors 82 similar to what is shown in FIG. 17B. In FIG. 17B, epitaxy layer 48-1 has a rectangular cross-sectional view shape. The GAA transistors 82 as shown in FIGS. 17D and 17E are essentially the same as what are shown in FIG. 17B, except that epitaxy layer 48-1 has trapezoidal shapes. In FIG. 17D, epitaxy layer 48-1 has a shorter sidewall contacting the respective nanostructure 22B and inner spacers 44, and the opposite sidewall is longer. In FIG. 17E, epitaxy layer 48-1 has a longer sidewall contacting the respective nanostructure 22B and inner spacers 44, and the opposite sidewall is shorter. It is also noted that FIGS. 17D and 17E are obtained from a cross-section in which no contact plugs 80A and 80B are formed. In other cross-sections, contact plugs 80A and 80B may be shown.

The embodiments of the present disclosure have some advantageous features. By selecting a substrate as having a {110} surface orientation, and aligning the channel directions (source-to-drain directions) of GAA transistors in a [110] direction of the substrate, the low-doping concentration epitaxy layers in the source/drain regions have a more uniform thickness, and hence the junction leakage and DIBL may be reduced.

In accordance with some embodiments of the present disclosure, a method comprises forming a protruding semiconductor stack comprising a plurality of sacrificial layers; and a plurality of nanostructures, wherein the plurality of sacrificial layers and the plurality of nanostructures are laid out alternatingly; forming a dummy gate structure on the protruding semiconductor stack; etching the protruding semiconductor stack to form a source/drain recess; and forming a first source/drain region comprising growing first epitaxial layers in the source/drain recess, wherein the first epitaxial layers are grown on sidewalls of the plurality of nanostructures, wherein a cross-section of each of the first epitaxial layers has a quadrilateral shape, and wherein the first epitaxial layers have a first dopant concentration; and forming a second epitaxial layer on the first epitaxial layers, wherein the second epitaxial layer has a second dopant concentration higher than the first dopant concentration. In an embodiment, the protruding semiconductor stack is formed over a semiconductor substrate having a {110} surface orientation. In an embodiment, the cross-section of each of the first epitaxial layers has a rectangular shape. In an embodiment, each of the first epitaxial layers comprises a first sidewall contacting one of the plurality of nanostructures; and a second sidewall opposite to the first sidewall, wherein the first sidewall and the second sidewall are parallel to each other. In an embodiment, the first sidewall and the second sidewall of the each of the first epitaxial layers have (110) surface orientations. In an embodiment, each of the first epitaxial layers comprises a top surface at a top surface level, a bottom surface at a bottom surface level, and a middle level in middle between the top surface level and the bottom surface level; and a top thickness measured at the top surface level, a bottom thickness measured at the bottom surface level, and a middle thickness measured at the middle surface level, wherein the top thickness, the bottom thickness, and the middle thickness are equal to each other. In an embodiment, when the first source/drain region is formed, a second source/drain region is formed on an opposite side of the protruding semiconductor stack than the first source/drain region, and wherein a direction pointing from the first source/drain region to the second source/drain region is a [110] lattice direction of the plurality of nanostructures. In an embodiment, the growing the first epitaxial layers comprises growing SiAs. In an embodiment, the growing the first epitaxial layers comprises growing SiCP.

In accordance with some embodiments of the present disclosure, a device comprises a plurality of nanostructures, with upper nanostructures in the plurality of nanostructures overlapping lower nanostructures in the plurality of nanostructures; a gate stack extending between the plurality of nanostructures; and a first source/drain region comprising first epitaxial layers on sidewalls of the plurality of nanostructures, wherein a cross-section of each of the first epitaxial layers has a quadrilateral shape, and wherein the first epitaxial layers have a first dopant concentration; and a second epitaxial layer on the first epitaxial layers, wherein the second epitaxial layer has a second dopant concentration higher than the first dopant concentration. In an embodiment, the device further comprises a semiconductor substrate having a {110} surface orientation, wherein the semiconductor substrate is underlying the plurality of nanostructures. In an embodiment, one of the plurality of nanostructures comprises a top surface at a top surface level, a bottom surface at a bottom surface level, and a middle level in middle between the top surface level and the bottom surface level, and wherein one of the first epitaxy layers contacting the one of the plurality of nanostructures comprises a top thickness measured at the top surface level; a bottom thickness measured at the bottom surface level; and a middle thickness measured at the middle surface level, wherein the top thickness, the bottom thickness, and the middle thickness are equal to each other. In an embodiment, the cross-section of each of the first epitaxial layers has a rectangular shape. In an embodiment, the cross-section of each of the first epitaxial layers has a trapezoid shape. In an embodiment, the device further comprises a second source/drain region formed on an opposite side of the plurality of nanostructures than the first source/drain region, wherein a direction pointing from the first source/drain region to the second source/drain region is in a [110] lattice direction of the plurality of nanostructures. In an embodiment, the first epitaxial layers comprise SiAs or SiCP, and the second epitaxial layer comprise SiP, and wherein the second epitaxial layer has a higher dopant concentration than the first epitaxial layers.

In accordance with some embodiments of the present disclosure, a device comprises a plurality of semiconductor layers, with upper semiconductor layers in the plurality of semiconductor layers overlapping lower semiconductor layers in the plurality of semiconductor layers, wherein each of the plurality of semiconductor layers comprises a top surface at a top surface level; a bottom surface at a bottom surface level; and a middle level between the top surface level and the bottom surface level; and a gate stack extending into spaces between the plurality of semiconductor layers; and a first source/drain region comprising first epitaxial layers on sidewalls of the plurality of semiconductor layers, wherein each of the first epitaxial layers has a top thickness measured at a top surface level of one of the plurality of semiconductor layers; a bottom thickness measured at the bottom surface level of the one of the plurality of semiconductor layers; and a middle thickness measured at a middle surface level in middle of the top surface level and the bottom surface level, wherein the top thickness, the bottom thickness, and the middle thickness are substantially equal to each other; and a second epitaxial layer on the first epitaxial layers, wherein the second epitaxial layer has a second dopant concentration different than a first dopant concentration of the first epitaxial layers. In an embodiment, the top thickness, the bottom thickness, and the middle thickness are equal to each other. In an embodiment, a cross-section of each of the first epitaxial layers has a trapezoid shape. In an embodiment, the device further comprises inner spacers between the plurality of semiconductor layers, wherein each of the first epitaxial layers further contacts the inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a protruding semiconductor stack comprising:
      a plurality of sacrificial layers; and
      a plurality of nanostructures, wherein the plurality of sacrificial layers and the plurality of nanostructures are laid out alternatingly;
   forming a dummy gate structure on the protruding semiconductor stack;
   etching the protruding semiconductor stack to form a source/drain recess; and
   forming a first source/drain region comprising:
      growing first epitaxial layers in the source/drain recess, wherein the first epitaxial layers are grown on sidewalls of the plurality of nanostructures, wherein a cross-section of each of the first epitaxial layers has a quadrilateral shape, and wherein the first epitaxial layers have a first dopant concentration; and
      forming a second epitaxial layer on the first epitaxial layers, wherein the second epitaxial layer has a second dopant concentration higher than the first dopant concentration.

2. The method of claim 1, wherein the protruding semiconductor stack is formed over a semiconductor substrate having a {110} surface orientation.

3. The method of claim 1, wherein the cross-section of each of the first epitaxial layers has a rectangular shape.

4. The method of claim 1, wherein each of the first epitaxial layers comprises:
   a first sidewall contacting one of the plurality of nanostructures; and
   a second sidewall opposite to the first sidewall, wherein the first sidewall and the second sidewall are parallel to each other.

5. The method of claim 4, wherein the first sidewall and the second sidewall of the each of the first epitaxial layers have (110) surface orientations.

6. The method of claim 1, wherein each of the first epitaxial layers comprises:
   a top surface at a top surface level, a bottom surface at a bottom surface level, and a middle level in middle between the top surface level and the bottom surface level; and
   a top thickness measured at the top surface level, a bottom thickness measured at the bottom surface level, and a middle thickness measured at the middle level, wherein the top thickness, the bottom thickness, and the middle thickness are equal to each other.

7. The method of claim 1, wherein when the first source/drain region is formed, a second source/drain region is formed on an opposite side of the protruding semiconductor stack than the first source/drain region, and wherein a direction pointing from the first source/drain region to the second source/drain region is a [110] lattice direction of the plurality of nanostructures.

8. The method of claim 1, wherein the growing the first epitaxial layers comprises growing SiAs.

9. The method of claim 1, wherein the growing the first epitaxial layers comprises growing SiCP.

10. A method comprising:
    forming a plurality of nanostructures, with upper nanostructures in the plurality of nanostructures overlapping lower nanostructures in the plurality of nanostructures;
    forming a first source/drain region comprising:
       epitaxially growing first epitaxial layers on sidewalls of the plurality of nanostructures, wherein a cross-section of each of the first epitaxial layers has a quadrilateral shape, and wherein the first epitaxial layers have a first dopant concentration; and
       epitaxially growing a second epitaxial layer on the first epitaxial layers, wherein the second epitaxial layer has a second dopant concentration higher than the first dopant concentration; and
    forming a gate stack comprising portions between the plurality of nanostructures.

11. The method of claim 10, wherein the plurality of nanostructures are formed over a semiconductor substrate having a {110} surface orientation.

12. The method of claim 10, wherein one of the plurality of nanostructures comprises:
    a top surface at a top surface level, a bottom surface at a bottom surface level, and a middle level between the top surface level and the bottom surface level, and wherein one of the first epitaxy layers contacting the one of the plurality of nanostructures comprises:
    a top thickness measured at the top surface level;
    a bottom thickness measured at the bottom surface level; and
    a middle thickness measured at the middle level, wherein the top thickness, the bottom thickness, and the middle thickness are equal to each other.

13. The method of claim 10, wherein the cross-section of one of the first epitaxial layers is grown as having a rectangular shape.

14. The method of claim 10, wherein the cross-section of one of the first epitaxial layers is grown as having a trapezoid shape.

15. The method of claim 10 further comprising forming a second source/drain region on an opposite side of the plurality of nanostructures than the first source/drain region, wherein a direction pointing from the first source/drain region to the second source/drain region is in a [110] lattice direction of the plurality of nanostructures.

16. The method of claim 10, wherein the first epitaxial layers comprise SiAs or SiCP, and the second epitaxial layer comprise SiP, and wherein the second epitaxial layer is doped to a higher dopant concentration than the first epitaxial layers.

17. A method comprising:
forming a plurality of semiconductor layers, with upper semiconductor layers in the plurality of semiconductor layers overlapping lower semiconductor layers in the plurality of semiconductor layers, wherein each of the plurality of semiconductor layers comprises:
a top surface at a top surface level;
a bottom surface at a bottom surface level; and
a middle level between the top surface level and the bottom surface level;
forming a gate stack extending into spaces between the plurality of semiconductor layers; and
forming a first source/drain region comprising:
forming first epitaxial layers on sidewalls of the plurality of semiconductor layers, wherein each of the first epitaxial layers is formed as having:
a top thickness measured at the top surface level of one of the plurality of semiconductor layers;
a bottom thickness measured at the bottom surface level of the one of the plurality of semiconductor layers; and
a middle thickness measured at a middle surface level in middle of the top surface level and the bottom surface level, wherein the top thickness, the bottom thickness, and the middle thickness are substantially equal to each other; and
forming a second epitaxial layer on the first epitaxial layers, wherein the second epitaxial layer is doped with a second dopant concentration different than a first dopant concentration of the first epitaxial layers.

18. The method of claim 17, wherein the top thickness, the bottom thickness, and the middle thickness are equal to each other.

19. The method of claim 17, wherein a cross-section of each of the first epitaxial layers has a trapezoid shape.

20. The method of claim 17 further comprising forming inner spacers between the plurality of semiconductor layers, wherein one of the first epitaxial layers further contacts one of the inner spacers.

* * * * *